United States Patent [19]

Unno

[11] Patent Number: 5,872,617
[45] Date of Patent: Feb. 16, 1999

[54] SCANNING TYPE EXPOSURE APPARATUS AND DEVICE MANUFACTURING METHOD

[75] Inventor: Yasuyuki Unno, Minamikawachi-machi, Japan

[73] Assignee: Canon Kabushiki Kaisha, Tokyo, Japan

[21] Appl. No.: 764,555

[22] Filed: Dec. 12, 1996

[30] Foreign Application Priority Data

Dec. 15, 1995 [JP] Japan .................................. 7-347936

[51] Int. Cl.$^6$ ................................................ G03B 27/68
[52] U.S. Cl. ................................................ 355/52; 355/71
[58] Field of Search .................... 355/52, 71, 67

[56] References Cited

U.S. PATENT DOCUMENTS

| | | | |
|---|---|---|---|
| 4,298,271 | 11/1981 | Sugiura et al. | 355/8 |
| 4,719,492 | 1/1988 | Hyodo | 355/52 |
| 4,897,688 | 1/1990 | Smith et al. | 355/52 |
| 5,121,160 | 6/1992 | Sano et al. | 355/53 |
| 5,184,176 | 2/1993 | Unno et al. | 355/52 |
| 5,459,000 | 10/1995 | Unno | 430/5 |
| 5,591,958 | 1/1997 | Nishi et al. | 250/205 |
| 5,642,183 | 6/1997 | Sugihara et al. | 355/71 |
| 5,684,566 | 11/1997 | Stanton | 355/67 |

FOREIGN PATENT DOCUMENTS

| | | |
|---|---|---|
| 0678768 | 10/1995 | European Pat. Off. . |
| 0681220 | 11/1995 | European Pat. Off. . |
| 6-188169 | 7/1994 | Japan . |
| 7-297117 | 11/1995 | Japan . |
| 8-008177 | 1/1996 | Japan . |
| 8-8178 | 1/1996 | Japan . |

OTHER PUBLICATIONS

Y. Unno, "Polarization Effect of Illumination Light", SPIE, vol. 1927, Optical/Laser Microlithography VI (1993), pp. 879–891.

M. Noguchi, et al., "Subhalf Micron Lithography System With Phase–Shifting Effect", SPIE, vol. 1674, Optical/Laser Microlithography V (1992), pp. 92–104.

Primary Examiner—David M. Gray
Assistant Examiner—John Chizmar
Attorney, Agent, or Firm—Fitzpatrick, Cella, Harper & Scinto

[57] ABSTRACT

A scanning type exposure apparatus includes an illumination device for illuminating a mask, a projection device for projecting a pattern of the mask onto a substrate and a scanning device for scanning, in a scanning direction, the mask and the substrate relative to the illumination device and the projection device, respectively. The projection device includes a stop device for setting an effective numerical aperture in the scanning direction to be larger than an effective numerical aperture in a direction perpendicular to the scanning direction. Also disclosed are various photomasks, as well as a scanning type exposure apparatus which scans and exposes a substrate by using such photomasks and a device manufacturing method that includes a step of transferring a device pattern onto a substrate by using such photomasks.

33 Claims, 34 Drawing Sheets

FIG. 5
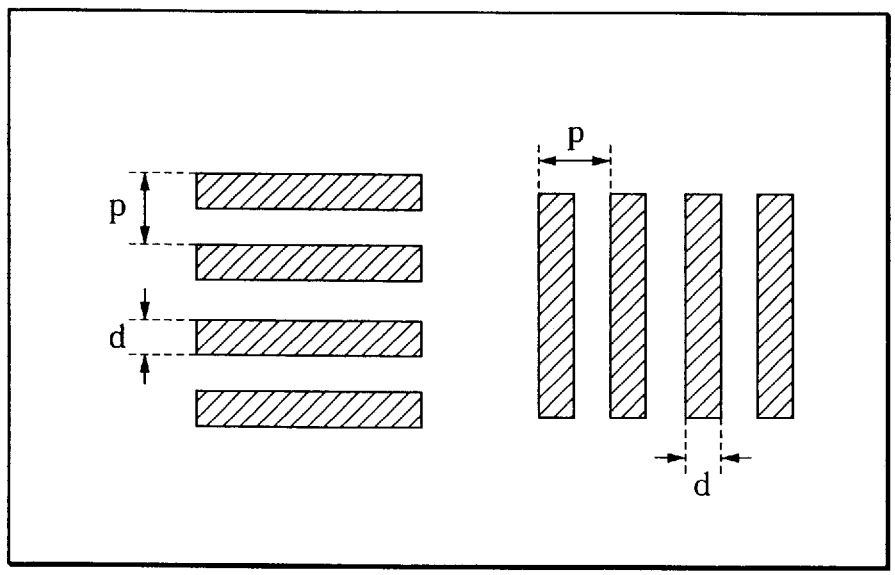
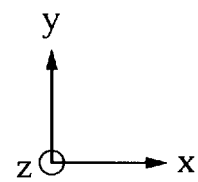
FIG. 6
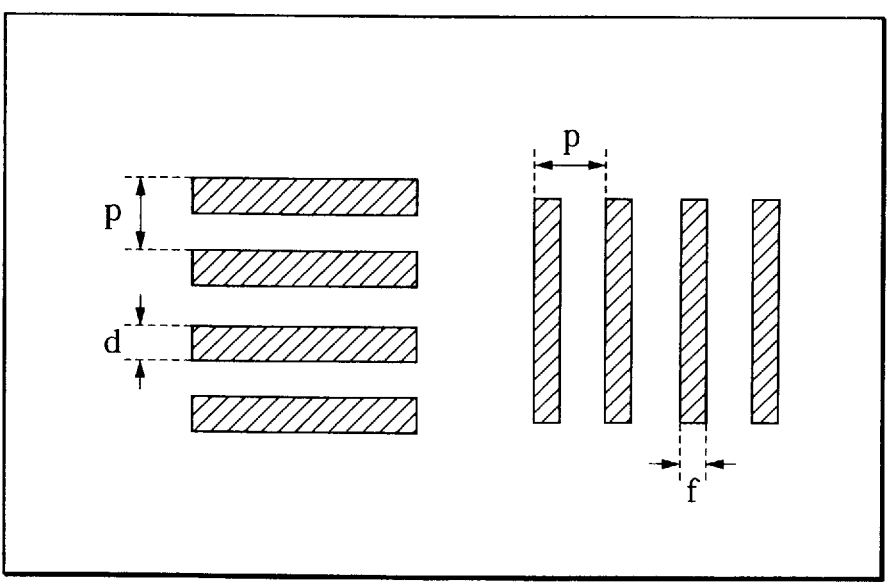
SCANNING DIRECTION

SCANNING DIRECTION

FIG. 13(A)
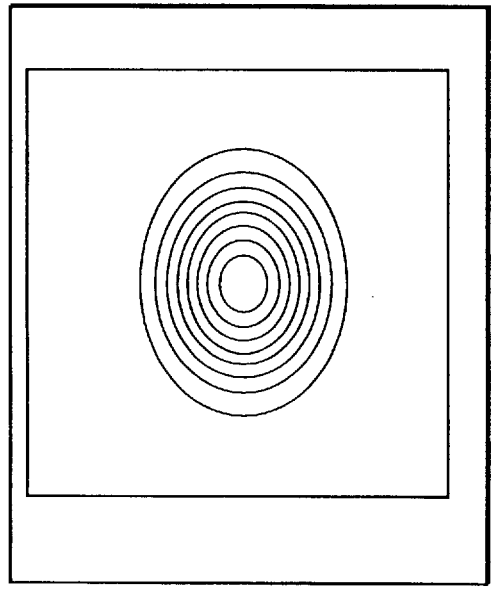
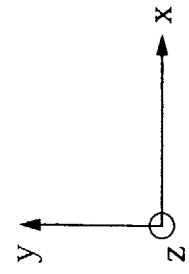
($\sigma x = \sigma y = 0$)
FIG. 13(B)
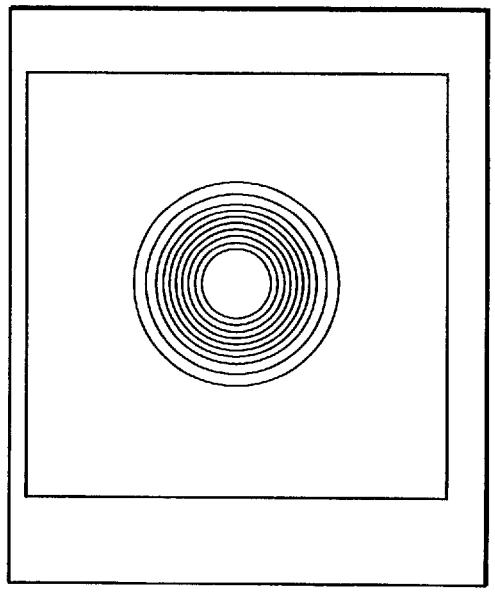
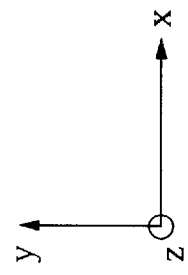
($\sigma x = 100nm$ ; $\sigma y = 50nm$)

FIG. 14(A-1)
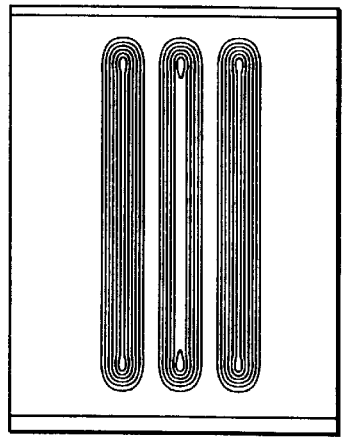
($\sigma x = \sigma y = 0$)
FIG. 14(A-2)
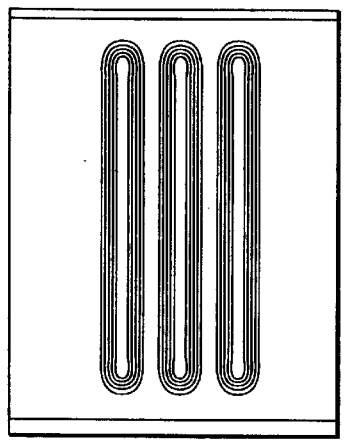
($\sigma x = 50nm$)
FIG. 14(A-3)
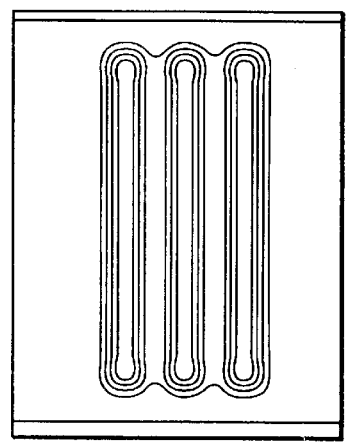
($\sigma x = 100nm$)
FIG. 14(B-1)
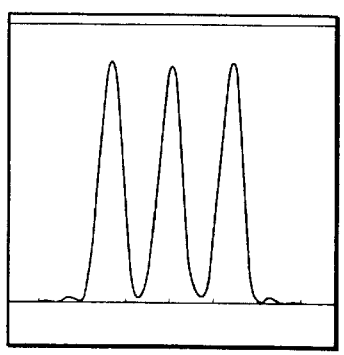
(Cross Section-
  Static Image)
FIG. 14(B-2)
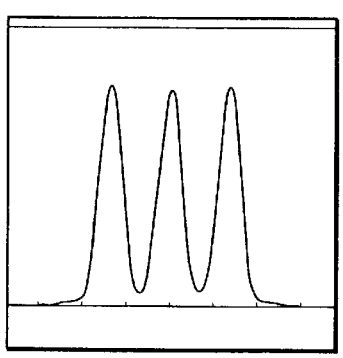
(Cross Section
  "50nm" Image)
FIG. 14(B-3)
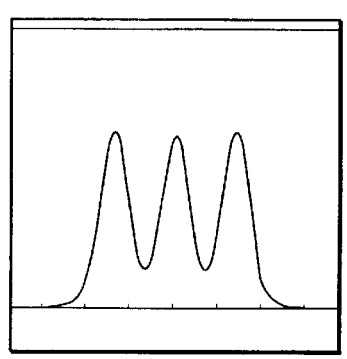
(Cross Section
  "100nm" Image)

SCANNING DIRECTION

FIG. 17(A)
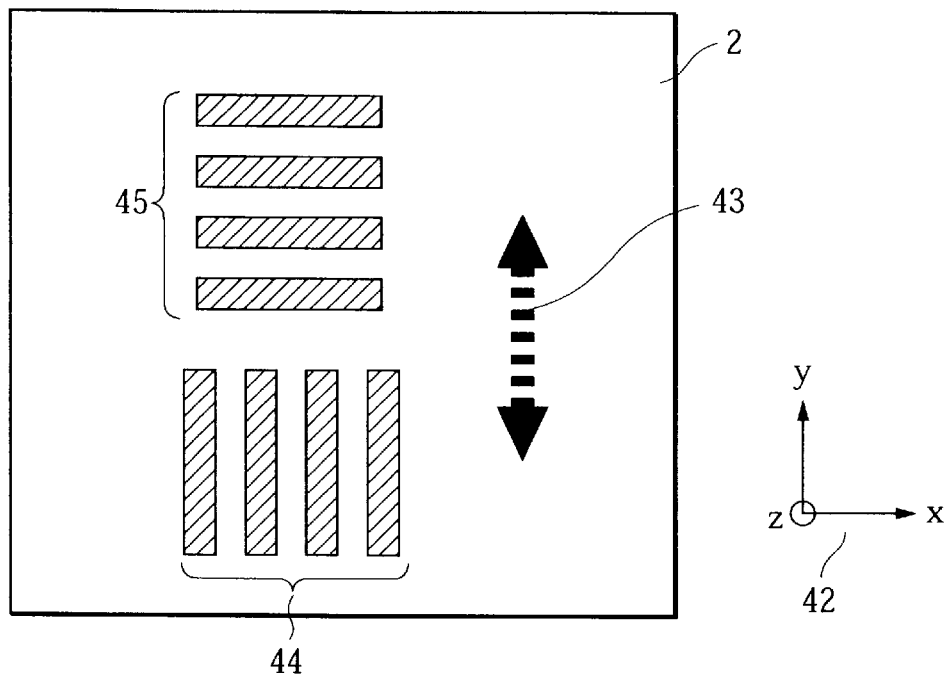
FIG. 17(B-1)
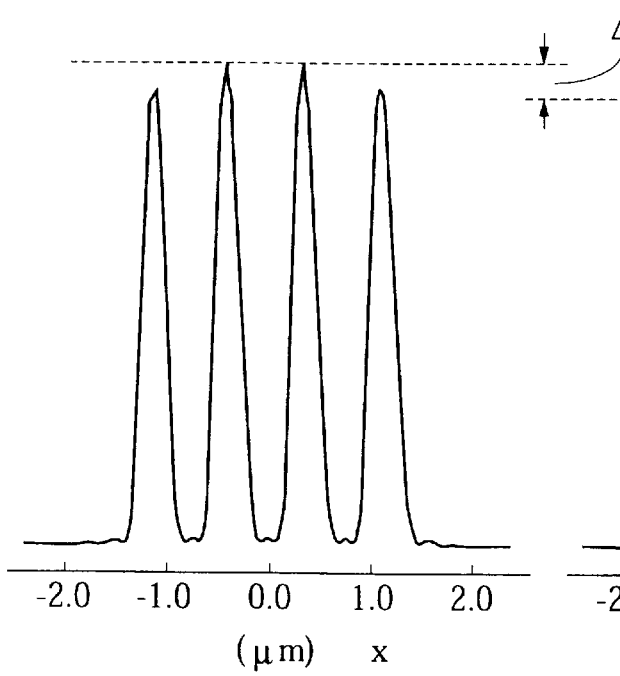
FIG. 17(B-2)
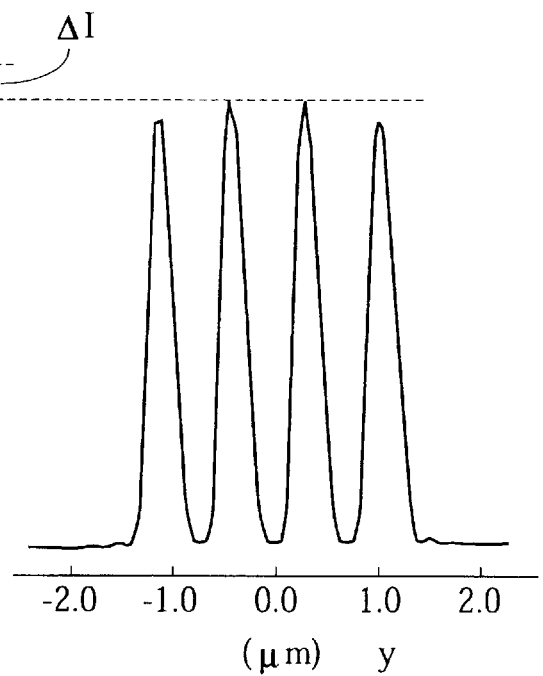

FIG. 25
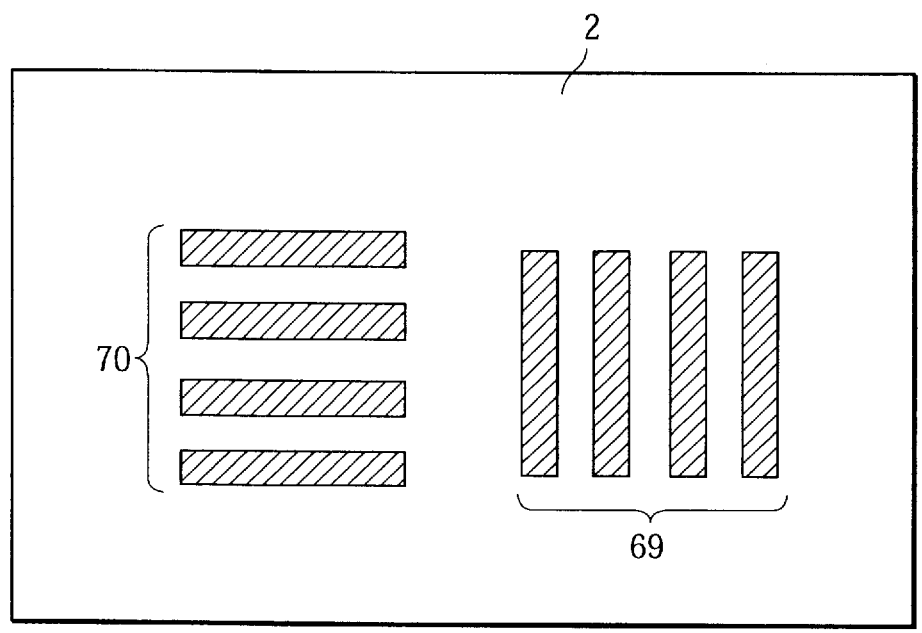
SCANNING DIRECTION
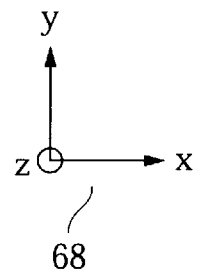

FIG. 26(A-1)
$\sigma_d = 0$
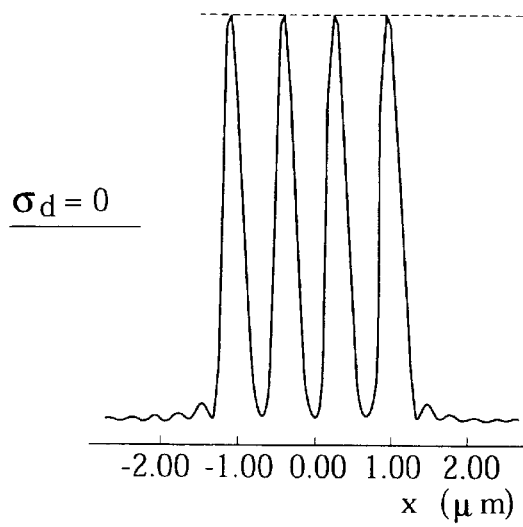
x (μm)
FIG. 26(A-2)
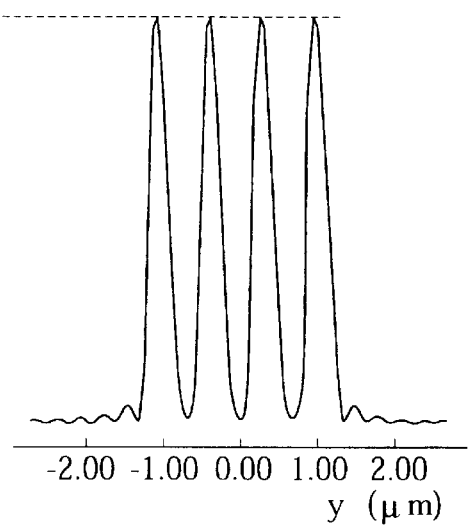
y (μm)
FIG. 26(B-1)
$\sigma_d = 0.2$
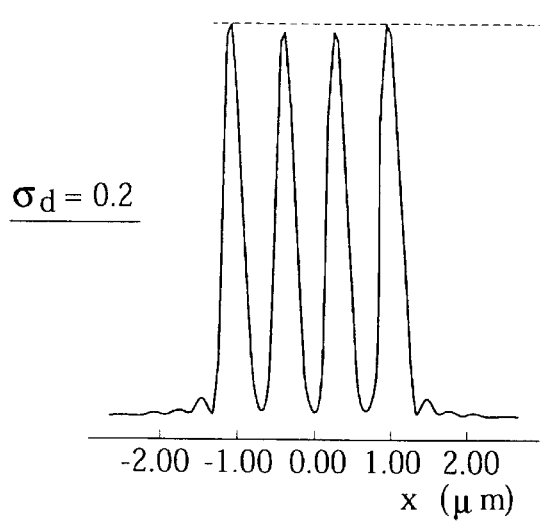
x (μm)
FIG. 26(B-2)
ΔI
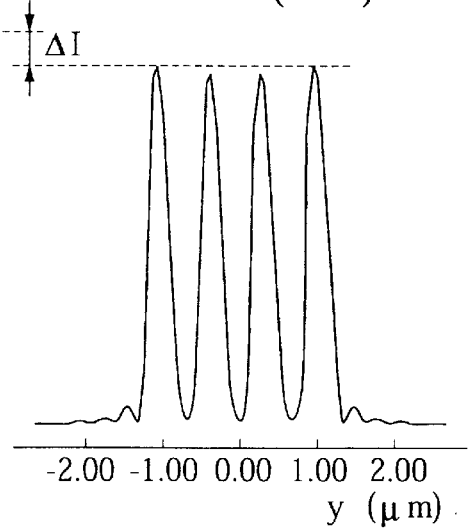
y (μm)
FIG. 26(C-1)
$\sigma_d = 0.3$
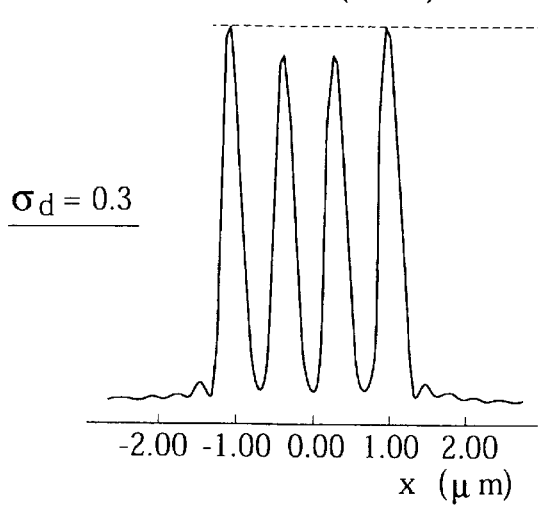
x (μm)
FIG. 26(C-2)
ΔI
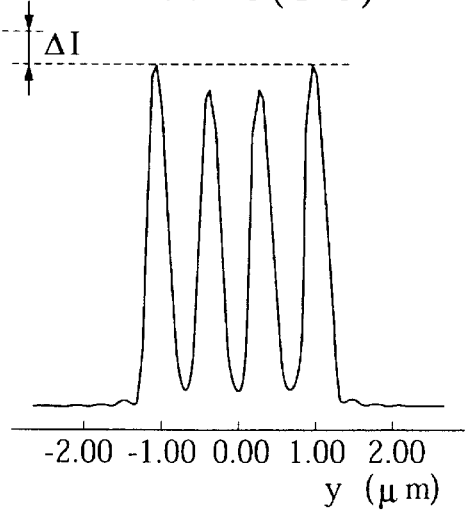
y (μm)

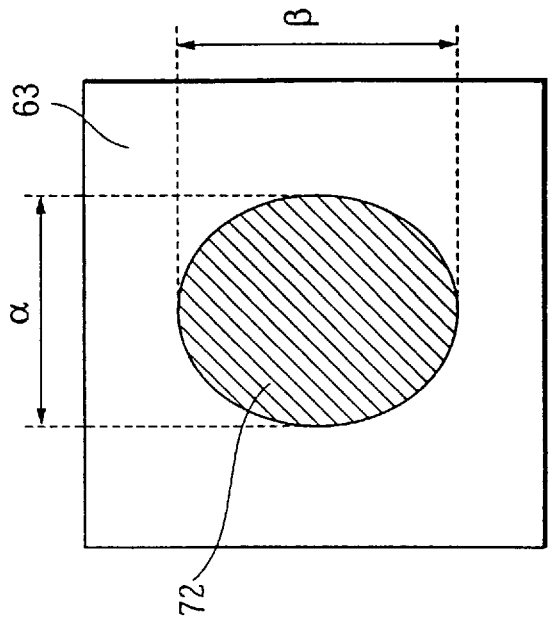
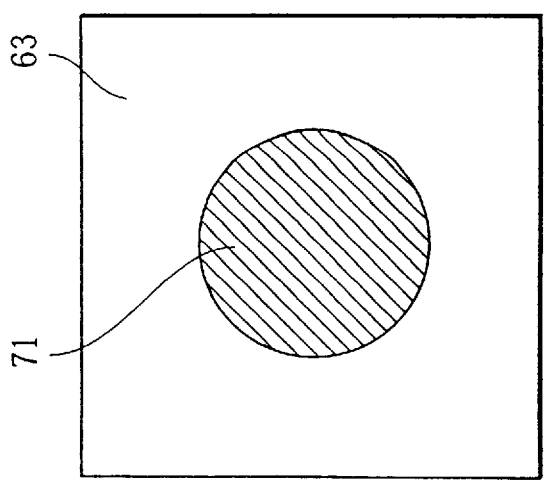
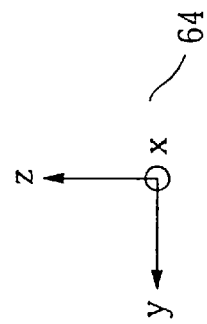

AMPLITUDE TRANSMITTANCE

AMPLITUDE ON WAFER

LIGHT INTENSITY ON WAFER

FIG. 36
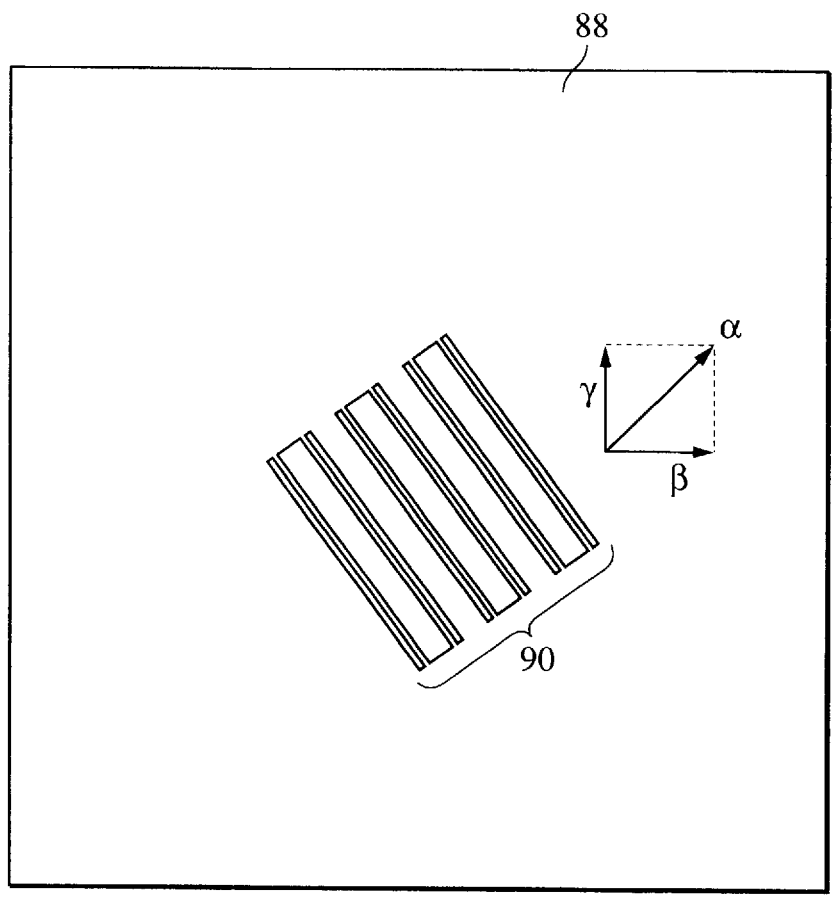
SCANNING DIRECTION

SCANNING TYPE EXPOSURE APPARATUS AND DEVICE MANUFACTURING METHOD

BACKGROUND OF THE INVENTION

1. Field of the Invention

The present invention relates to a scanning type exposure apparatus and a device manufacturing method and, more particularly, to a scanning type exposure apparatus and a device manufacturing method suitably applied when various devices, such as a semiconductor device such as an IC or an LSI, a display device such as a liquid crystal display element, and a sensor device such as a magnetic head, are manufactured.

2. Description of the Related Art

In recent years, the integration density of a semiconductor device such as an IC or an LSI has increasingly accelerated, and a micropatterning technique for a semiconductor wafer in accordance with the increase in integration density has considerably developed. As examples of the micropatterning technique, various reduced projection exposure apparatuses (steppers), each of which forms the image of a circuit pattern on a mask (reticle) onto a photosensitive substrate by a projection optical system and exposes the photosensitive substrate by a step and repeat scheme, have been proposed.

In this type of stepper, a circuit pattern on a reticle is reduced and projected at a predetermined position (shot) onto a wafer surface through a projection optical system having a predetermined reduction ratio to be transferred, and, after the projection and transformation are performed once, the stage on which the wafer is placed is moved by a predetermined amount to transfer the image on another shot. These steps are repeated to entirely expose the wafer. In recent years, as examples of such projection exposure apparatuses, various step and scan exposure apparatuses, each using a scanning mechanism which can obtain a high resolution and extend the size of the exposure region, have been proposed.

Such a step and scan exposure apparatus has a slit-like exposure area and scans a reticle and a wafer with respect to an illumination optical system and a projection optical system to expose a shot. Upon completion of scanning exposure of one shot, the wafer shifts to the next step, and scanning exposure of the next shot is performed. This procedure is repeated to entirely expose the wafer.

FIG. 10 is a perspective view showing a main portion of a conventional step and scan exposure apparatus. Referring to FIG. 10, reference numeral 201 denotes a reticle on which a circuit pattern is drawn, and reference numeral 202 denotes a projection lens for projecting the circuit pattern on the reticle 201 onto a semiconductor wafer 203. Reference numeral 204 denotes a stage on which the semiconductor wafer 203 is placed.

An illumination optical system 205 does not illuminate the entire circuit pattern on the reticle 201, but illuminates only a slit-like illumination area 206. On the semiconductor wafer 203, the image of the circuit pattern is transferred to only exposure area 207, which is a portion of semiconductor wafer 203. However, in this state of the circuit pattern, only the portion in the illumination area 206 is transferred. For this reason, the reticle 201 is scanned at a predetermined speed along a direction shown by arrow 208, and at the same time, the stage 204 is scanned along a direction shown by arrow 209 at a speed obtained by multiplying the scanning speed of the reticle 201 by the imaging magnification of the projection lens 202, to transfer the entire circuit pattern on the reticle 201 onto a shot area on the semiconductor wafer 203.

After the entire circuit pattern on the reticle 201 is transferred to the shot area of the semiconductor wafer 203, at a predetermined position, the stage 204 is moved (i.e., stepped) by a predetermined amount, and the circuit pattern is newly transferred to another shot area on the semiconductor wafer 203 by the same method. This procedure is repeated in the same manner as described above.

Referring to FIG. 10, reference numeral 210 indicates x-y-z coordinate axes. That is, an optical axis 211 of the projection lens 202 is defined in the z direction, the longitudinal directions of the illumination area 206 and the exposure area 207 are defined in the y direction, and the scanning directions of the reticle 201 and the stage 204 are defined in the x direction. This definition of the coordinate axes remains the same throughout this application, unless otherwise specified.

The reason why the step and scan exposure scheme can obtain an exposure area larger than that of a conventional stepper scheme, which is performed without using scanning, will be described below with reference to FIGS. 11(A) and 11(B).

In a conventional stepper scheme, an exposure area is limited to a range in which the aberration of a projection lens is preferably corrected. As an example, the range in which the aberration of the projection lens is corrected is indicated by a circle 221 (radius: r) in FIG. 11(A), and it is assumed that a circuit pattern is within a square area. In this case, the exposure area is the maximum square inscribed in the circle 221, i.e., a square whose side has a length of $\sqrt{2}r$ as indicated by region 222 in FIG. 11(A). The area $2r^2$ of the square is the area of an exposure region obtained by a conventional stepper scheme. In this case, the x and y axes of a coordinate system 223 are defined to have the same directions as those of two perpendicular sides of the square 222 as shown in FIG. 11(A).

As shown in FIG. 11(B), when the shape inscribed in the circle 221, whose aberration is corrected, is changed from a square to a rectangle 224, the length of the long side (y-axis direction) of the rectangle 224 becomes close to 2r. At this time, when the circuit pattern is scanned by a light flux in an area of the rectangle 224 in the x-axis direction to transfer the entire pattern onto a wafer, the area of the exposure area is determined to be 2rs (s: length in which scanning can be performed). This area can be set to be larger than the area $2r^2$. The step and scan scheme is designed for such an extension of the exposure area.

In a conventional step and scan exposure apparatus, both a reticle and a wafer are scanned to transfer an image. Therefore, synchronization between the reticle and the wafer must be precisely controlled during scanning.

However, when the scanning speed is increased to increase the throughput of the exposure apparatus, generation of a high-frequency asynchronous vibration component cannot be completely suppressed, and the positional relationship between the reticle and the wafer disadvantageously varies with time.

This phenomenon will be described below with reference to FIGS. 12(A) through 12(C). Referring to these figures, a coordinate system is defined as indicated by reference numeral 230 in FIG. 12(C), and it is assumed that a reticle 231 (FIG. 12(A)) and a wafer 232 (FIG. 12(C)) are arranged at optically conjugate positions with respect to the projection lens 233 (FIG. 12(B)). The reticle 231 is scanned in the x-axis positive direction (indicated by an arrow 234), and the wafer 232 is scanned in an x-axis negative direction (indicated by an arrow 235), thereby transferring the entire pattern.

In this case, attention is given to one small area (indicated by an area 236 in FIG. 12(A)) on the reticle 231. The moment the area 236 overlaps an illumination area 237 at time t=t1, the image of a pattern drawn at this portion is formed at the position of an image point 238 of the projection lens 233. In this case, the image point 238 is located at an end of an exposure area 239, and the image of the area 236 portion on the reticle 231 is transferred to the position of an area 240 on the wafer 232.

When scanning advances, the reticle 231 moves to positions indicated by time t=t2 and t=t3. (The reticle 231 is illustrated as being shifted in the z direction with time in FIG. 12(A) to make a positional change of the area 236 conspicuous. In actual scanning, however, the position of the area 236 is fixed in the z direction, and the reticle 231 and the wafer 232 move in only the x direction.)

At time t=t2 and time t=t3, the images of patterns in the area 236 are formed at image points 241 and 242 of the projection lens 233, and the wafer 232 is controlled such that the position of the area 240 moves in accordance with these images. However, when the scanning speeds of the reticle 231 and the wafer 232 increase, the positions of the reticle 231 and the wafer 232 cannot be completely synchronized with each other. Consequently, as indicated by a shift amount $\Delta x$ in FIG. 12(C), a position at which the image of the pattern is created is shifted from a position at which the image is supposed to be transferred.

The vibration component which cannot be completely removed by synchronous control is generally generated at a very high frequency, and the sign of the shift amount $\Delta x$ is inverted many times while the area 240 passes through the exposure area 239. An image to be transferred to one position on the wafer 232 overlaps an image transferred to an adjacent position, since a variation in position of approximately $\Delta x$ is repeated during scanning in the exposure area 239. As a result, an image in the scanning direction is degraded.

The above influence has been analyzed using simulation in, J. Bischoff, W. Henke, J. Werf, and P. Dirksen, "Simulation on Step & Scan Optical Lithography", Proceedings on SPIE, Vol. 2197, pp. 953–964, 1994. is An influence of a high-frequency asynchronous vibration component on the image of a pattern will be described below in accordance with the results analyzed in this paper.

As influences of vibration in scanning exposure, influences in the scanning direction (the x direction in FIGS. 12(A) through 12(C)) and in a direction (the y direction in these figures) perpendicular to the scanning direction may occur. Vibrations in both the directions are considered in this case. Assume that a positional shift amount $\Delta y$ in the y direction is considered the same as a positional shift amount $\Delta x$ in the x direction. In this case, it is known that variations in magnitude of the shift amounts $\Delta x$ and $\Delta y$ almost depend on the Gaussian distribution. As a probability density function related to position, a function expressed by the following equation can be defined for each of the x and y components:

$$D(\Delta) = \frac{1}{\sigma\sqrt{2\pi}} \exp\left(\frac{-\Delta^2}{2\sigma^2}\right)$$

In this case, $\sigma$ is a standard deviation, where $\sigma=\sigma x$ is set for $\Delta=\Delta x$, and $\sigma=\sigma y$ is set for $\Delta=\Delta y$. Therefore, it is shown that an image having vibration can be obtained by calculating a function between a light intensity distribution obtained in an ideal state free from vibration and a function $D(\Delta)$ given by the above equation.

A typical calculation described in the above paper is now discussed. FIGS. 13(A) and 13(B) show a result obtained such that an image of a 0.3×0.3 contact hole pattern is calculated under the conditions: wavelength of exposure light=248 nm; and NA (numerical aperture) of a projection optical system=0.5. FIG. 13(A) shows an ideal state free from vibration, and FIG. 13(B) shows a state wherein a high-frequency vibration having an amplitude of $\sigma y=50$ nm exists in the y direction. In an actual exposure apparatus, vibration in the y direction can be suppressed to be less than the asynchronous component in the x direction (scanning direction). Therefore, the result shown in FIG. 13(B) is understood to be approximately a result obtained in a real system.

As is apparent from FIG. 13(B), the obtained intensity distribution has a shape extending in the scanning direction, and the pattern of the contact hole is transferred with distortion. This poses a serious problem when a semiconductor circuit element having a high integration density is manufactured.

FIGS. 14(A-1) to 14(B-3) are views for explaining results obtained by examining the influences of vibration on images of patterns each constituted by three lines. Each line width is 0.3 $\mu$m, and the other conditions are the same as those in the above description. In this case, the influences of vibration on patterns are repeated in the x direction (scanning direction). FIG. 14(A-1) shows a contour line distribution of light intensity of an image free from vibration, and FIGS. 14(A-2) and 14(A-3) show contour line distributions of light intensities of images degraded when an asynchronous component increases. FIGS. 14(B-1) to 14(B-3) are obtained from FIGS. 14(A-1) to 14(A-3) by plotting light intensities along the ordinates.

Since vibration in the y direction is suppressed to be less than vibration in the x direction as described above, the image of a pattern repeated in the y direction is degraded less than the image of the pattern repeated in the x direction. As a result, when patterns having the same cycle/line width are considered, the characteristics of an image to be transferred are dependent on whether the pattern has a periodicity in the y direction (direction perpendicular to the scanning direction) or the x direction (scanning direction). For this reason, the size of a pattern on a resist obtained as a product varies depending on the above-referenced direction, and a serious hinderance occurs in the manufacture of semiconductor elements.

SUMMARY OF THE INVENTION

It is an object of the present invention to provide a scanning type exposure apparatus capable of providing a resolution in a scanning direction equal to that in a direction perpendicular to the scanning direction, a photomask capable of providing a resolution in a scanning direction equal to that in a direction perpendicular to the scanning direction, and a method of manufacturing a device using the scanning type exposure apparatus and the photomask of this invention.

In one aspect, a scanning type exposure apparatus according to the present invention comprises illumination means for illuminating a mask, projection means for projecting a pattern of the mask onto a substrate, and scanning means for scanning, in a scanning direction, the mask and the substrate relative to the illumination means and the projection means, respectively, wherein the projection means is designed such that an effective numerical aperture in the scanning direction is different from an effective numerical aperture in a direction perpendicular to the scanning direction.

In another aspect, a scanning type exposure apparatus according to the present invention comprises illumination means for illuminating a mask, projection means for projecting a pattern of the mask onto a substrate, and scanning means for scanning, in a scanning direction, the mask and the substrate relative to the illumination means and the projection means, wherein the projection means comprises stop means for setting an effective numerical aperture in the scanning direction to be larger than an effective numerical aperture in a direction perpendicular to the scanning direction.

In yet another aspect, a photomask according to the present invention comprises an isolated pattern which has substantially the same dimensions with respect to first and second directions that are perpendicular to each other, a pair of auxiliary patterns arranged to sandwich the isolated pattern with respect to the first direction, and no auxiliary patterns for sandwiching the isolated pattern with respect to the second direction.

In yet another aspect, a photomask according to the present invention comprises a first pattern in which lines and spaces are alternately arranged with respect to a first direction, a second pattern in which lines and spaces are arranged with respect to a second direction, perpendicular to the first direction, the lines and spaces of the second pattern having substantially the same dimensions as those of the lines and spaces of the first pattern, and phase-shift means applied to the first pattern, wherein no phase-shift means is applied to the second pattern.

In yet another aspect, a photomask according to the present invention comprises an isolated pattern which has substantially the same dimensions with respect to first and second directions that are perpendicular to each other, and polarization means, applied to the isolated pattern, for forming light linearly polarized in the second direction.

In still another aspect, a photomask according to the present invention comprises a first pattern in which lines and spaces are alternately arranged with respect to a first direction, a second pattern in which lines and spaces are alternately arranged with respect to a second direction, perpendicular to the first direction, the lines and spaces of the second pattern having substantially the same dimensions as the lines and spaces of the first pattern, respectively, and polarization means, applied to the first pattern, for forming light linearly polarized in the second direction, wherein no polarization means is applied to the second pattern.

In still another aspect, a scanning type exposure apparatus according to the present invention includes a scanning type exposure apparatus for scanning any one of the photomasks discussed above.

In still another aspect, a device manufacturing method according to the present invention includes the step of transferring a device pattern onto a substrate by using any one of the various scanning type exposure apparatuses, in conjunction with any one of the photomasks, described above.

BRIEF DESCRIPTION OF THE DRAWINGS

FIG. 5 is a view for explaining a pattern on a reticle surface used in the first embodiment.

FIG. 6 is a view for explaining the pattern on the reticle surface used in the first embodiment.

FIGS. 13(A) and 13(B) are views for explaining distortions of a hole pattern in the step and scan scheme.

FIGS. 14(A-1) to 14(B-3) are views for explaining degradation of resolution in the step and scan scheme.

FIGS. 17(A), 17(B-1) and 17(B-2) are respectively a view and graphs for explaining the relationship between a cycle pattern and a polarization state.

FIG. 25 is a view for explaining a pattern on a reticle surface in FIG. 22.

FIGS. 26(A-1) to 26(C-2) are views for explaining intensity distributions of the pattern in FIG. 25.

FIGS. 27(A) and 27(B) are views for explaining an aperture according to the third embodiment.

FIG. 36 is a view for explaining another reticle according to the fourth embodiment.

DESCRIPTION OF THE PREFERRED EMBODIMENTS

Figure 1:
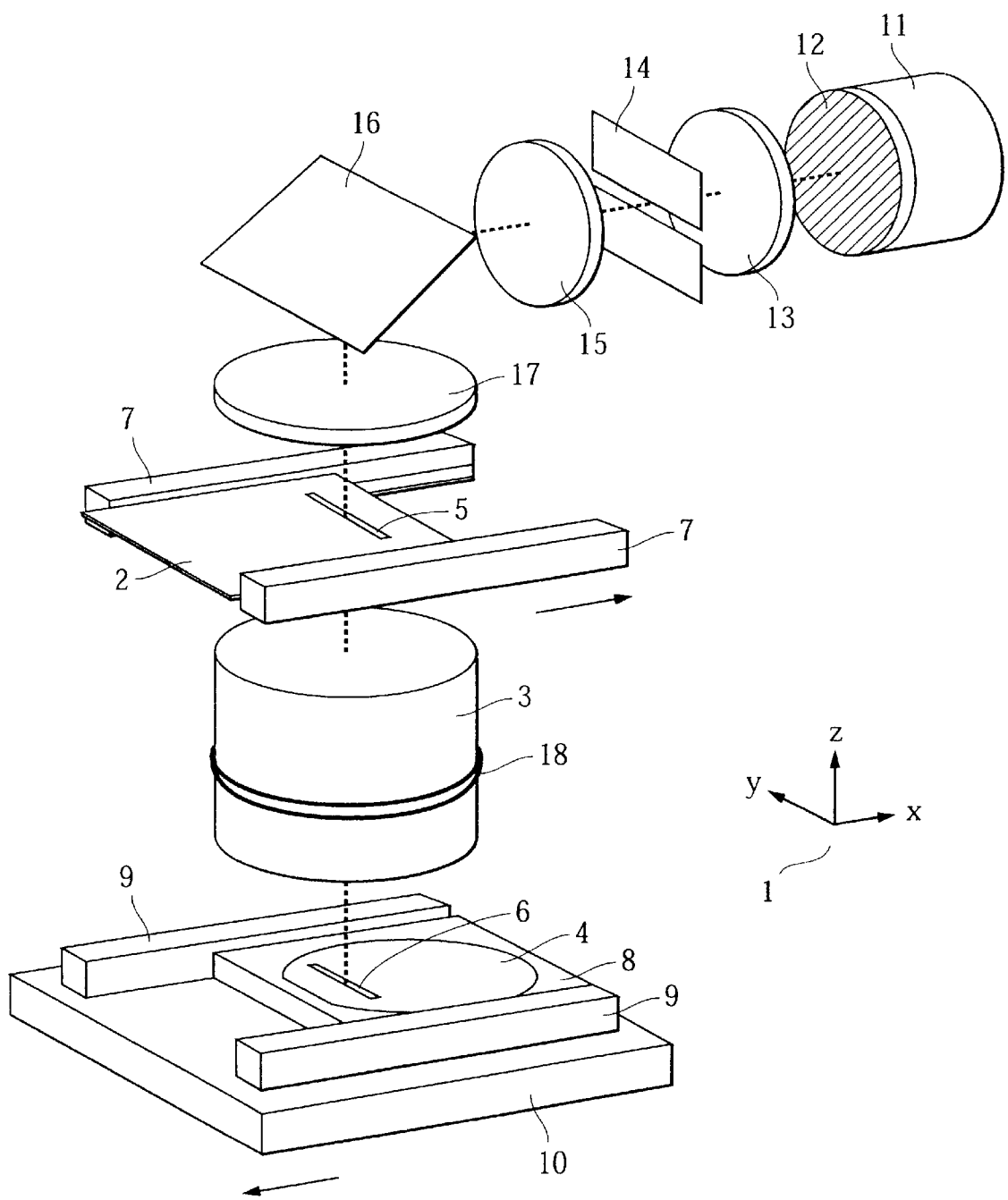
FIG. 1 is a schematic view showing a main portion of the first embodiment of the present invention.
Figure 2:
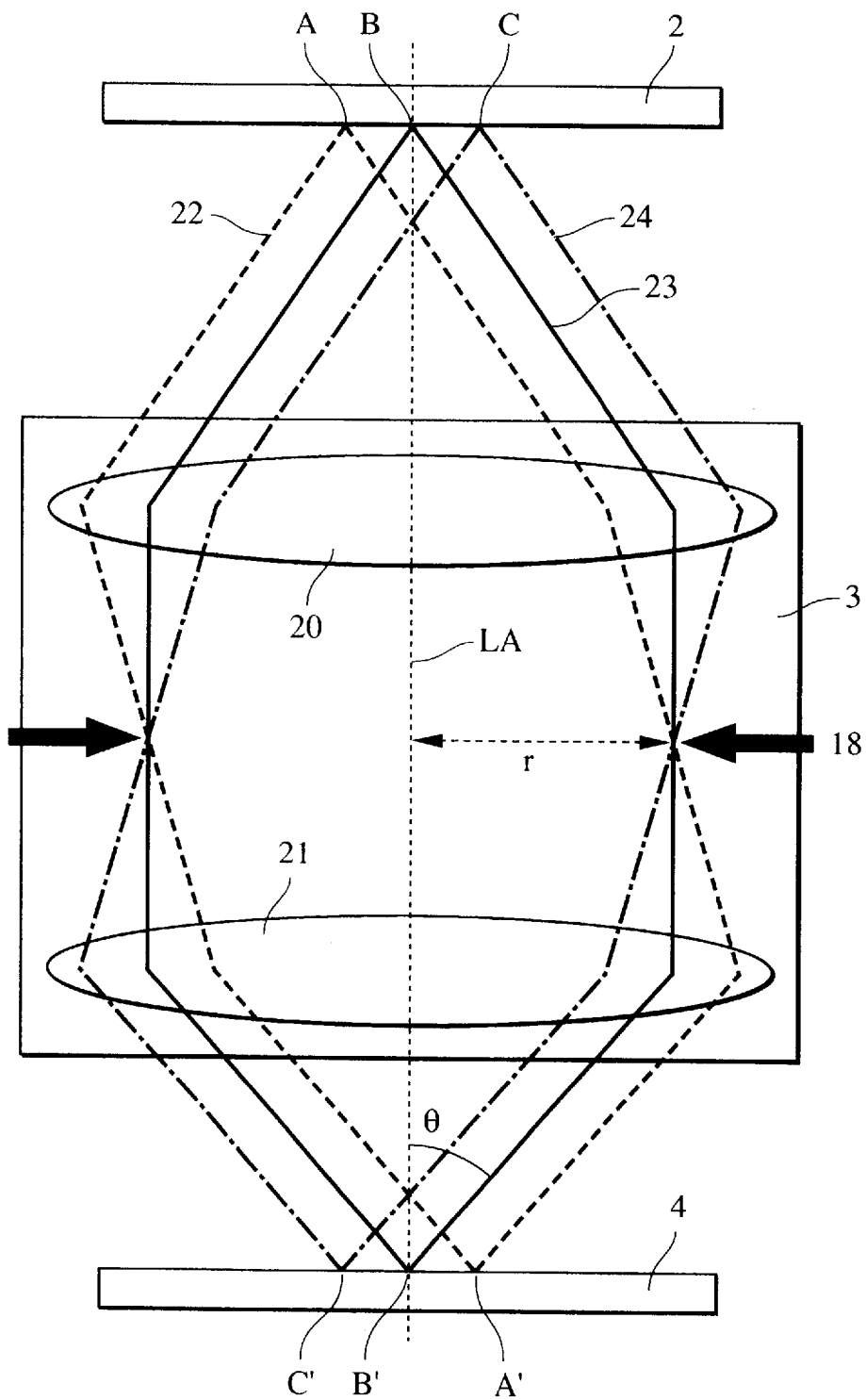
FIG. 2 is a light path view of a portion of FIG. 1.
Figure 3:
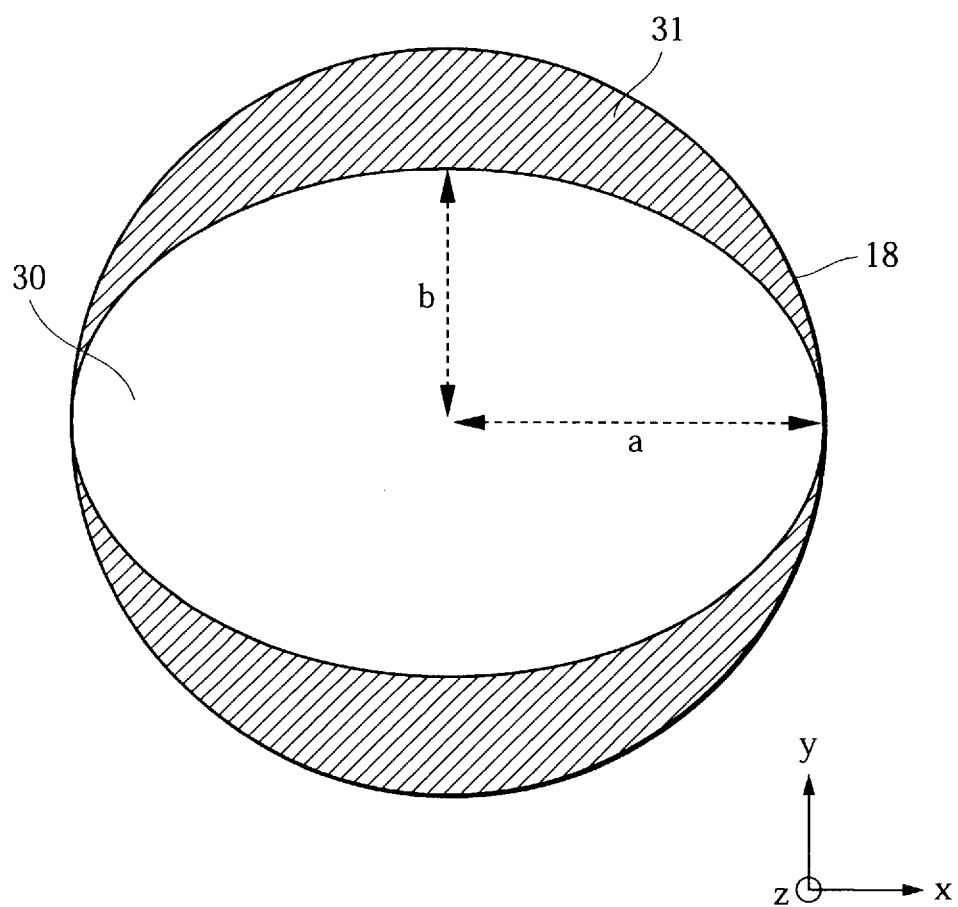
FIG. 3 is a view explaining a portion of FIG. 1.

FIG. 1 is a schematic view showing a main portion of the first embodiment of the present invention, FIG. 2 is a view showing a light path of a portion of FIG. 1, and FIG. 3 is an enlarged view for explaining a portion of FIG. 1. Referring to FIG. 1, for descriptive convenience, an x-y-z coordinate system 1 is shown for reference. Referring to FIG. 1, reference numeral 2 denotes a reticle on which a circuit pattern, serving as a first object, is drawn; 3, a projection lens (projection optical system (or a combination of a lens and a mirror)); and 4, a semiconductor wafer (e.g., a silicon wafer) serving as a second object.

In this embodiment, the circuit pattern on the reticle 2 is projected and exposed onto the wafer 4, which is coated with a photosensitive material such as a resist, at a magnification of 1/N times (N>1) by a step and scan scheme through the projection lens 3. In the exposure apparatus using the step and scan scheme, the pattern on the reticle 2 is not illuminated all at once, but an illumination area 5 having a slit-like shape is formed. The pattern on the reticle 2 located in the illumination area 5 is transferred onto an exposure area 6 on the wafer 4 through the projection lens 3.

During exposure, the reticle 2 is scanned by moving a reticle stage 7 in the x direction. The wafer 4 is placed on a movable stage 8, and, during exposure, the movable stage 8 is scanned along a guide portion 9 in the -x direction, opposing the x direction movement of the reticle 2. Reference numeral 10 denotes a stage on which the entire portions of the movable stage 8 and the guide portion 9 are placed. The stage 10, together with the movable stage 8 and the guide portion 9, constitute a wafer stage. The reticle 2 and the wafer 4 are synchronously scanned at a speed ratio corresponding to the projection magnification of the projection lens 3 in opposite directions. The scanning speed of the wafer 4 is obtained by multiplying the projection magnification of the projection lens 3 by the scanning speed of the reticle 2.

Reference numeral 11 denotes a light source unit including a light source such as an excimer laser or a high-pressure mercury lamp and a plurality of optical elements. Reference numeral 12 denotes a light-exit portion of a homogenizer (integrator) (not shown) such as a fly's eye array lens. In an actual apparatus, a secondary light source is formed at the position of the light-exit portion 12. The discussion below is made on an assumption that the light-exit portion 12 is considered to be a substantial light source. For this reason, for convenience, the light-exit portion 12 is called a "secondary light source".

An illumination light flux exiting from the secondary light source 12 is guided to a reticle blind 14 through a lens 13. The reticle blind 14 has a slit-like opening extending in the y direction, as shown in FIG. 1, to form the slit-like illumination area 5. The light flux from the slit-like opening of the reticle blind 14 illuminates the reticle 2 through a lens 15, a mirror 16, and a condenser lens 17.

In this case, the reticle blind 14 and the reticle 2 are arranged at optically conjugate positions, and the reticle blind 14 or the reticle 2 and the secondary light source 12 have an optical Fourier transform relationship. As a matter of course, the reticle 2 and the wafer 4 are optically conjugate with each other. A position having optical Fourier transformation with respect to the reticle 2 and the wafer 4 is present in the projection lens 3. At this position, light flux diffracted in the same direction from various positions on the reticle 2 is focused on one point. For this reason, when the effective diameter of a system at this position is controlled, the numerical aperture (NA) of the projection lens 3 can be changed. This position is called a pupil position, and is indicated by reference numeral 18 in FIG. 1.

A characteristic feature of the first embodiment is to make the resolution of the projection lens 3 in the scanning direction different from the resolution in the direction perpendicular to the scanning direction by controlling the effective diameter of the system at the pupil position 18.

The relationship between the effective diameter of the projection lens 3 at the pupil position 18 and the NA of the projection lens 3 will be described below with reference to FIG. 2. The projection lens 3 is generally constituted by several tens of lens elements. However, in FIG. 2, lens elements 20 and 21 are shown before and after the pupil position 18, for convenience, to show the arrangement of the projection lens 3. Light fluxes 22, 23, and 24 exiting from three different points A, B, and C on the reticle 2 are focused on three points A', B', and C', respectively, on a wafer 4 by the projection lens 3 to transfer a pattern image. In this case, since the light fluxes 22, 23, and 24 completely overlap at the pupil position 18, when the radius r of the pupil whose center coincides with the optical axis (LA) is controlled, the extensions of the light fluxes 22, 23, and 24 can be changed at the same time.

For descriptive convenience, although light fluxes from the three points A, B, and C are shown in FIG. 2, the above arrangement can be applied to all points on the reticle 2 in the illumination area. The NA of the projection lens 3 is expressed by $n \times \sin\theta$ by using $\theta$ in FIG. 2, where n is the refractive index of an image space medium. When air is used as the medium, n=1 is set.

It is known that the size of the minimum pattern which can be resolved by an optical system is proportional to $\lambda/NA$ ($\lambda$: wavelength of light). In the first embodiment, the effective diameter at the pupil position 18, i.e., the NA of the projection lens 3, is controlled to adjust the resolution. In this case, different resolutions are set for different pattern directions, respectively.

As described above with reference to FIGS. 13(A) through 14(B-3), in an arrangement in which the entire pattern on the reticle surface is transferred onto the wafer surface by synchronous scanning of the reticle 2 and the wafer 4, the image is extended by generating a high-frequency asynchronous vibration in the scanning direction, which degrades the resolution. As a result, the resolution in a scanning direction is apparently more degraded than the resolution in a direction perpendicular to the scanning direction, and a pattern to be transferred onto a wafer cannot easily be controlled in size. For this reason, according to the first embodiment, the NA of the projection lens in the scanning direction is made different from the NA of the projection lens in the direction perpendicular to the scanning direction, so that the resolutions in both directions are made almost equal to each other.

FIG. 3 shows the opening of the pupil position 18 of the projection lens 3 (i.e., the opening of the aperture diaphragm). The first embodiment is described under the following conditions. That is, the reticle 2 and the wafer 4 are arranged parallel to the x-y plane, and both of them are scanned in the x direction. For this reason, the scanning direction is the x direction. Referring to FIG. 3, reference numeral 30 denotes an opening through which light flux passes, and a hatched portion 31 indicates a light-shielding portion. The ratio of openings in the x and y directions is set to be a : b (a>b), so that the NA in the x direction is made larger than the NA in the y direction. For this reason, when an asynchronous high-frequency vibration is not caused by scanning, the resolution in the x direction is set to be higher than that in the y direction.

Figure 4A:
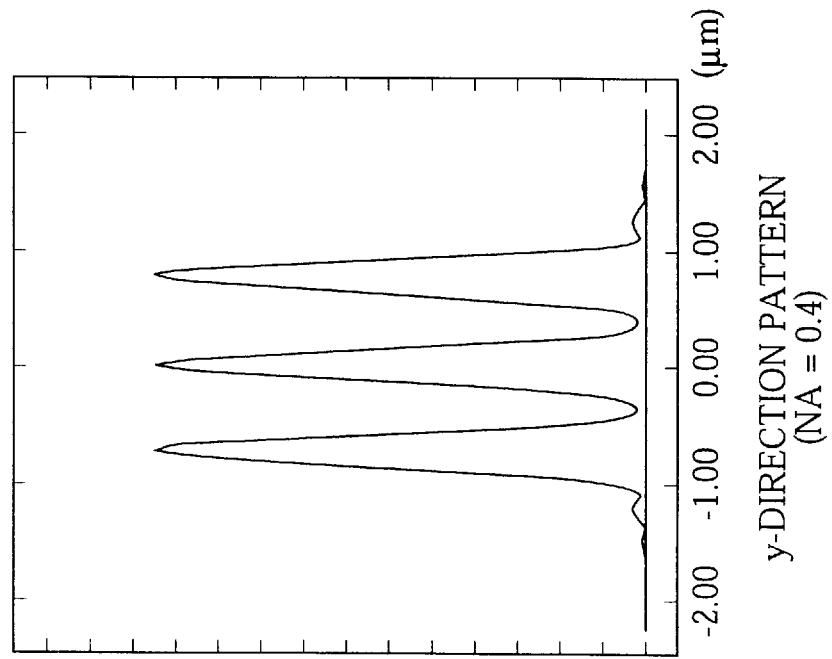
FIGS. 4(A) and 4(B) are graphs for explaining the contrasts of projection patterns obtained in the first embodiment.
Figure 4B:
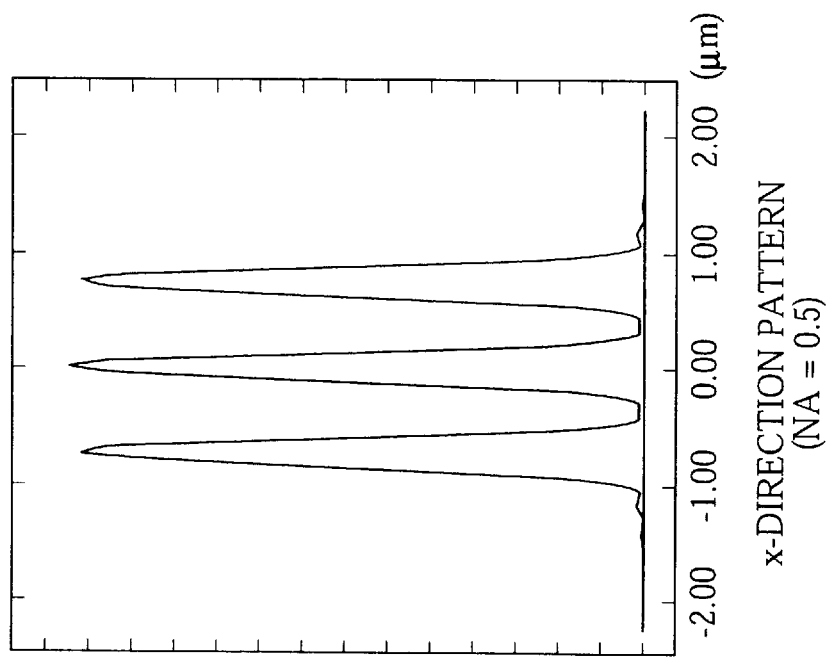

FIGS. 4(A) and 4(B) show, as a concrete example, results obtained such that the light intensity distributions of an image are calculated with respect to a repetitive pattern in the x direction and a repetitive pattern in the y direction under the conditions wherein repetitive patterns consisting of lines and spaces each having a dimension of 0.3 $\mu$m are exposed by light having a wavelength of $\lambda$=248 nm. In this case, these calculations are performed where NAx=the NA of the projection lens 3 in the x direction, NAy=the NA of the projection lens 3 in the y direction, such that NAx=0.5, and NAy=0.4. In addition, $\sigma$=5 is set in each calculation. If the projection lens 3 is designed to satisfy NA=0.5, the opening may be shielded from light by 20% in the y direction under the above conditions, i.e., b/a=0.8 may be set.

As is apparent from FIGS. 4(A) and 4(B), the image of a pattern in the x direction has a contrast higher than that of the image of a pattern in the y direction. These images are obtained when synchronous control in scanning is ideally performed. In fact, the influence of image extension caused by scanning affects the pattern image in the x direction. As a result, the contrasts of the pattern images in the x and y directions are equal to each other.

The first embodiment is arranged such that similar images can be obtained on a wafer with respect to the patterns in the x and y directions in consideration of the image extension caused by scanning in the scanning direction. In this case, the ratio of NAs in the x and y directions is determined in consideration of the magnitude of an asynchronous vibration component in scanning.

In the calculations shown in FIGS. 4(A) and 4(B), it is assumed that the line widths of the patterns in the x and y directions are equal to each other. More specifically, as shown in FIG. 5, a pitch p and a line width d in the x direction are set to be equal to those in the y direction.

In contrast to this, as shown in FIG. 6, although the pitches p in the x and y directions are equal to each other, a line width f of a pattern in the x direction (scanning direction) may be set to be smaller than the line width d of the pattern in the y direction, i.e., f<d may be satisfied, so that the resolution of the x-direction pattern image is made substantially equal to the y-direction pattern image. In this case, the ratio of the line width d to the line width f is totally determined in consideration of the magnitude of asynchronous high-frequency vibration caused by scanning and the ratio of the NAs of the projection lens 3 in the x and y directions. This method will be valid when the projection lens limit is larger than the pitch of the pattern.

Figure 7:
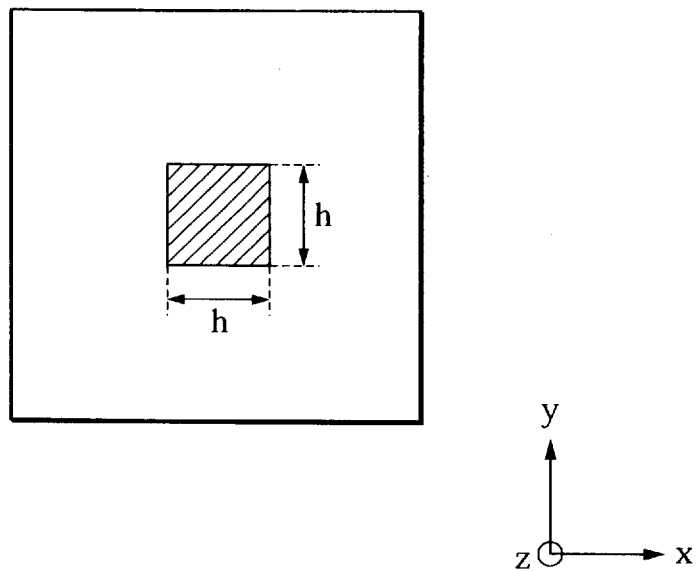
FIG. 7 is a view for explaining a pattern on another reticle surface used in the first embodiment.
Figure 8:
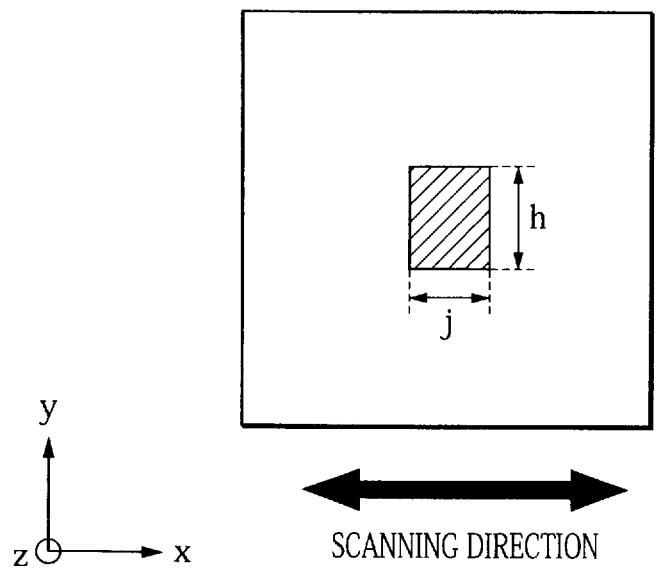
FIG. 8 is a view for explaining a pattern on still another reticle surface used in the first embodiment.

Similarly, with respect to a hole pattern having the same dimensions h in the x and y directions as shown in FIG. 7, the dimension h is changed into a dimension j in the x direction (scanning direction) (j<h) as shown in FIG. 8. In this manner, the pattern to be transferred to a resist together with the influence of vibration has a shape symmetrical in the x and y directions. In this case, the ratio of h to j is totally determined in consideration of the magnitude of asynchronous high-frequency vibration caused by scanning and the ratio of the NAs of the projection lens 3 in the x and y directions. This method will be valid when the size of the hole pattern is larger than the resolution limit of the projection lens.

Figure 9:
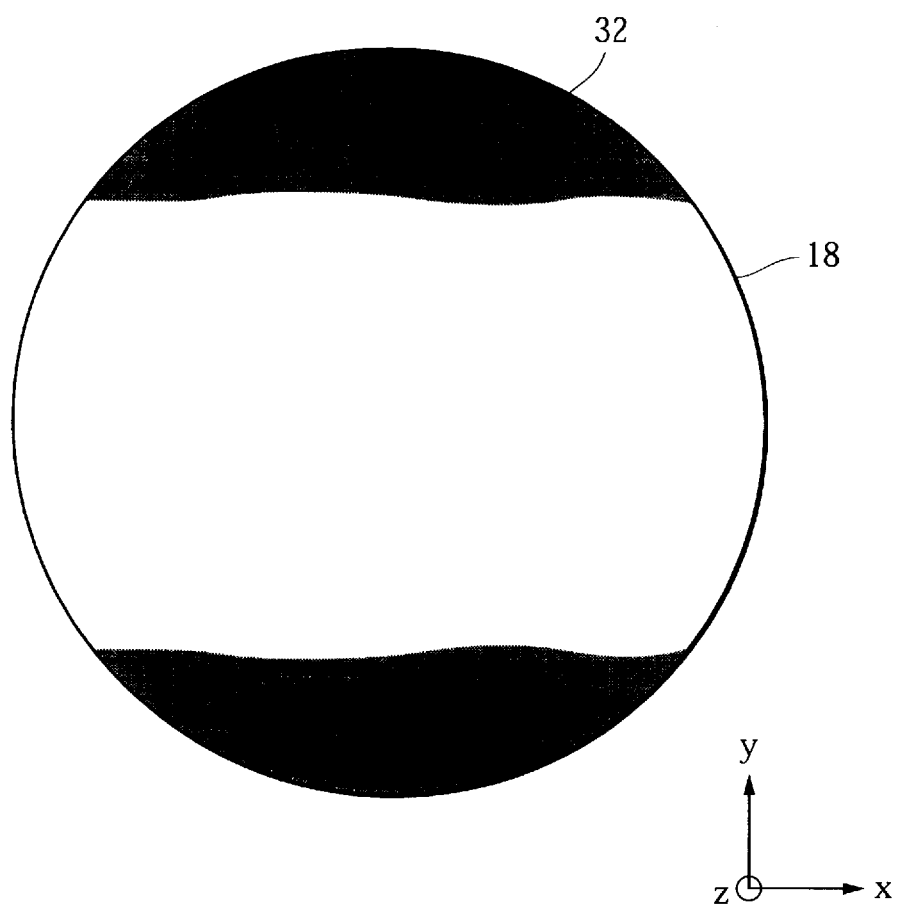
FIG. 9 is a view for explaining a light amount regulation portion used in the first embodiment.
Figure 10:
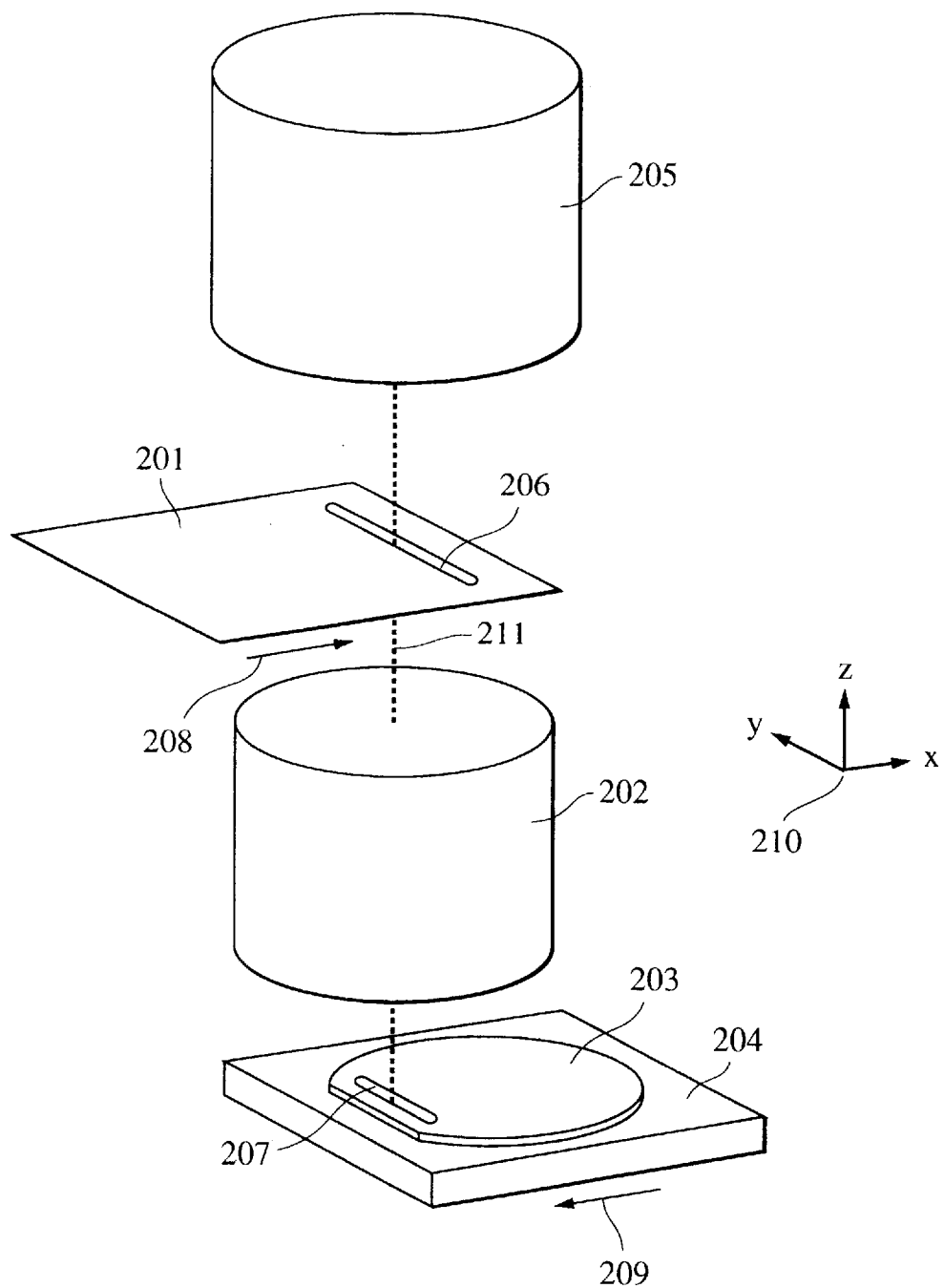
FIG. 10 is a schematic view showing a main portion of a conventional step and scan exposure apparatus.
Figure 11B:
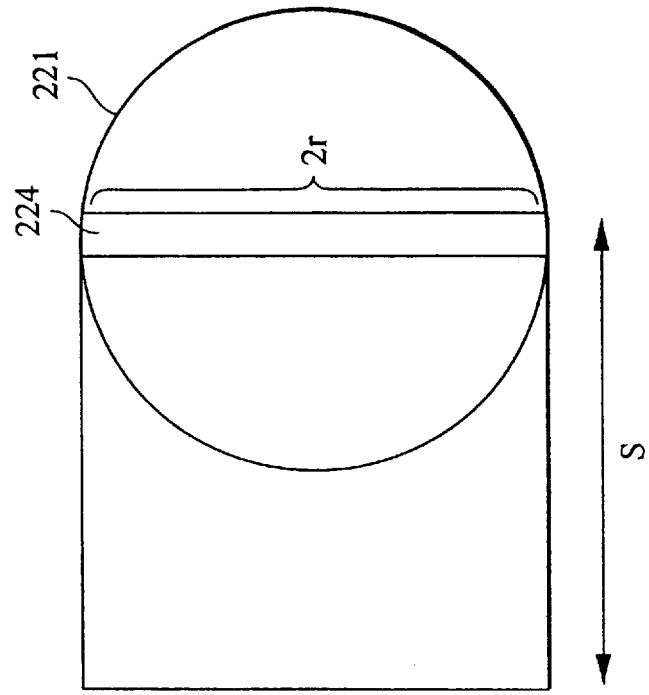
FIGS. 11(A) and 11(B) are views for explaining an exposure area in a step and scan scheme.
Figure 11A:
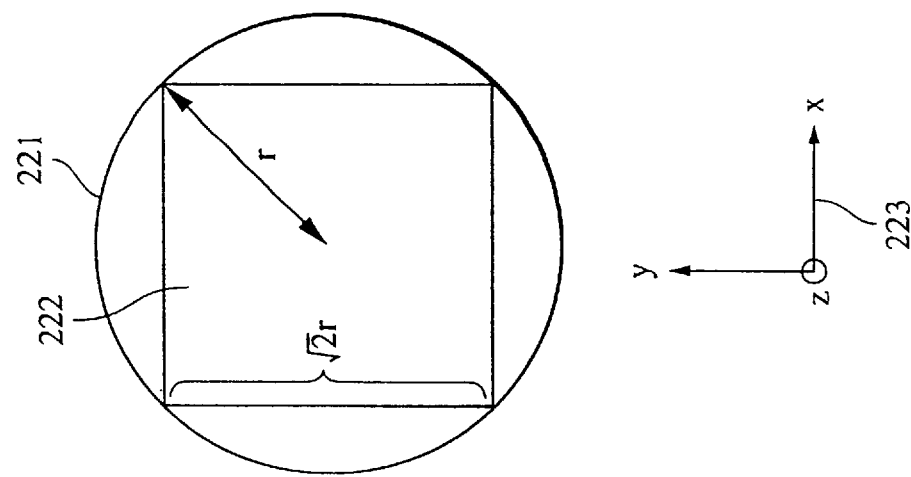
Figure 12A:
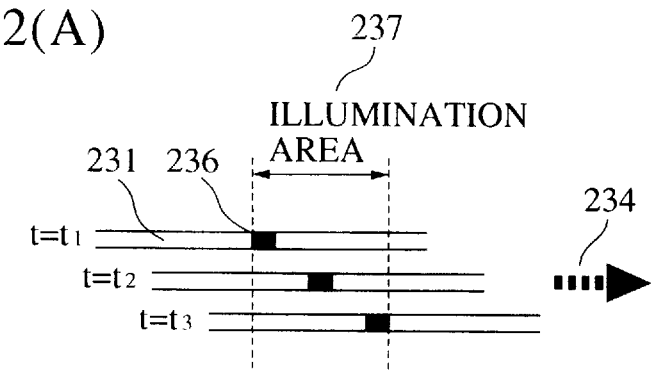
FIGS. 12(A) through 12(C) are views for explaining an influence of asynchronous high-frequency vibration in a step and scan scheme.
Figure 12B:
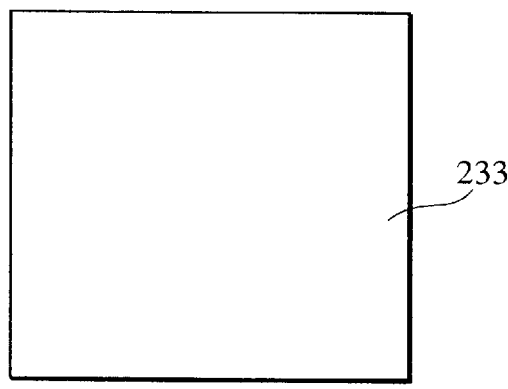
Figure 12C:
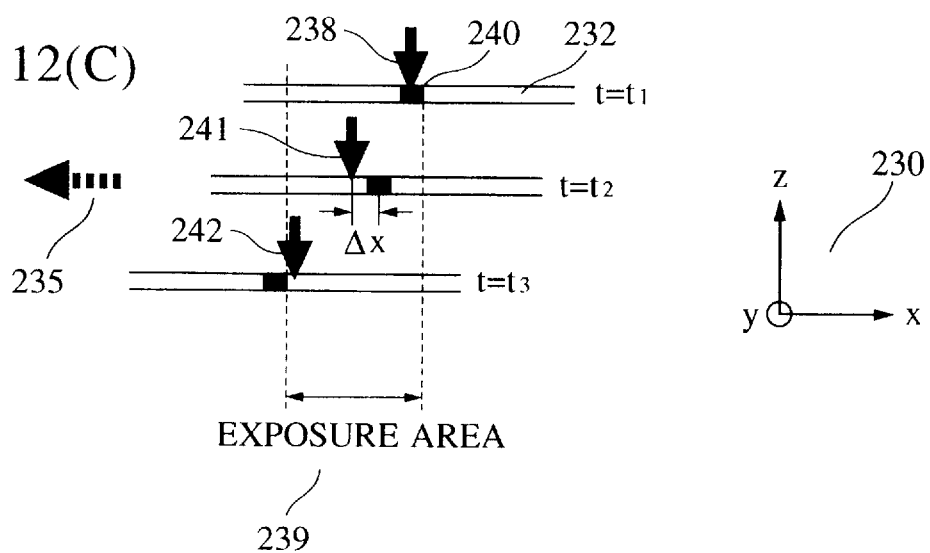

Instead of shielding the light flux passing through the pupil position 18 to decrease the width of the opening in the y direction as shown in FIG. 3, the transmittance of the peripheral portion of the opening in the y direction may be decreased to decrease the peripheral light amount of the light flux passing through the pupil position 18, thereby obtaining the same effect as described above. More specifically, as shown in FIG. 9, a filter (light amount control member) for decreasing an amplitude transmittance may be arranged at the position of the meshed portion 32, so that the NA of the projection lens 3 in the y direction is substantially decreased.

The above description has been made on an assumption that an image is more degraded in the direction parallel to the scanning direction than in the direction perpendicular to the scanning direction due to the influence of vibration generated by the scanning. In fact, in a typical exposure apparatus, the influence of image degradation in the scanning direction conspicuously appears. However, when the influence of vibration in the direction perpendicular to the scanning direction relatively increases under some special conditions, the NA of the projection lens 3 may be increased in the direction perpendicular to the scanning direction.

Figure 15:
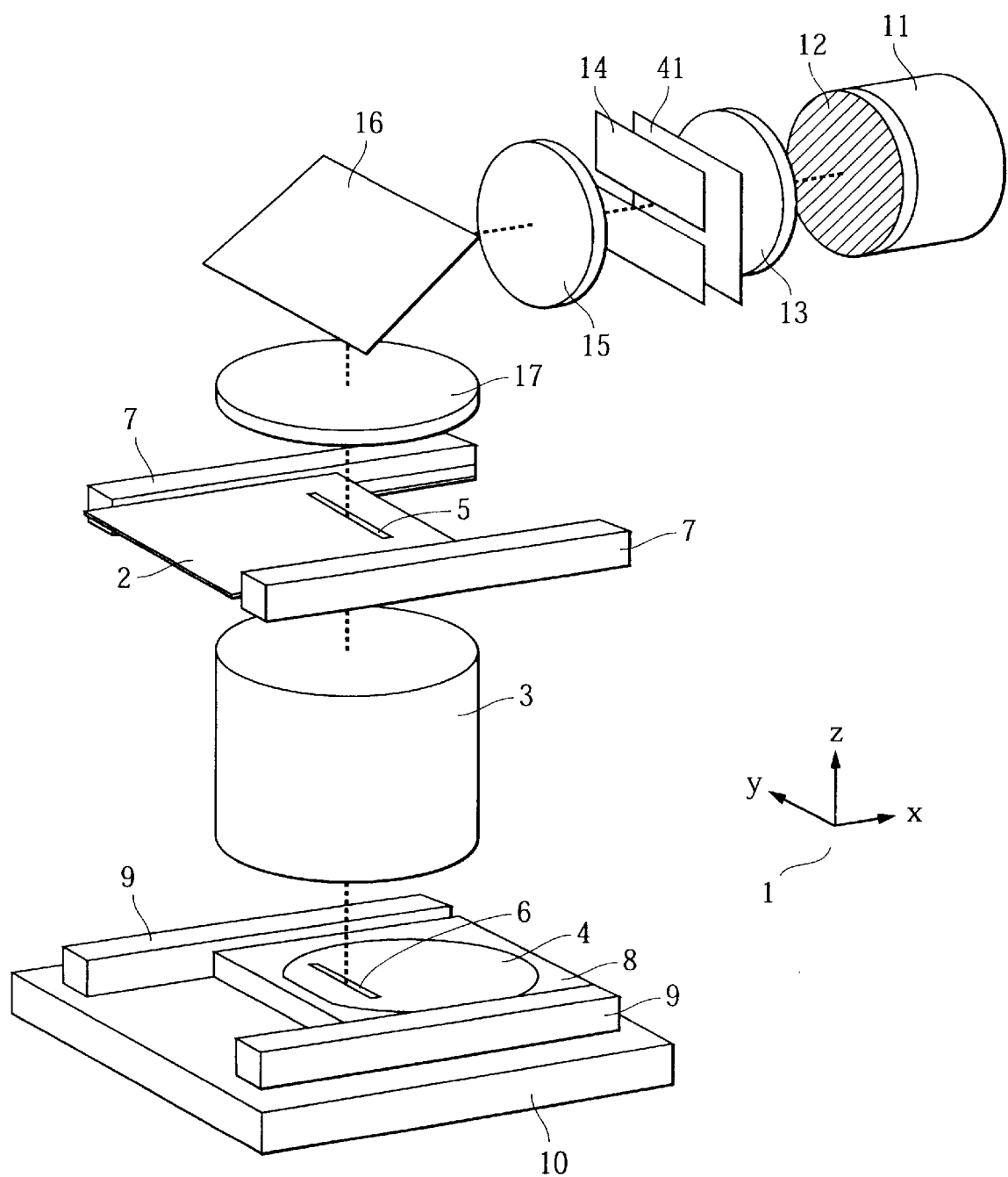
FIG. 15 is a schematic view showing a main portion of the second embodiment of the present invention.
Figure 16:
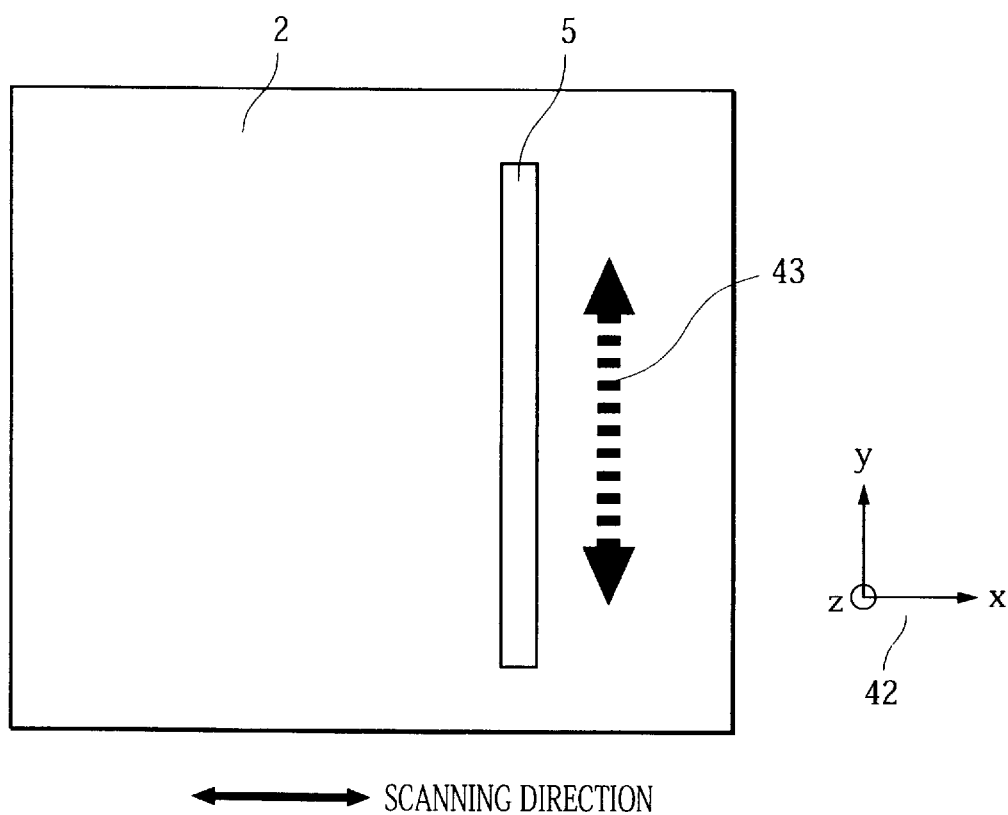
FIG. 16 is a view for explaining a portion of FIG. 15.

FIG. 15 is a schematic view showing a main portion of the second embodiment of the present invention, and FIG. 16 is an enlarged view showing a portion of FIG. 15. The second embodiment has the same arrangement as that of the first embodiment except that a general circular aperture diaphragm is arranged at the pupil position 18 of the projection lens 3, and a polarization device 41 for controlling the polarization state of the projection light flux incident on a surface of a second object such as a wafer is arranged in an optical path extending from the lens 13 and the reticle blind 14.

The respective elements in the second embodiment will be described below, although this description partially overlaps the description of FIG. 1. Referring to FIG. 15, reference numeral 2 denotes a reticle on which a circuit pattern, serving as a first object, is drawn; 3, a projection lens (projection optical system mirror (or a combination of a lens and a mirror)); and 4, a semiconductor wafer (e.g., a silicon wafer) serving as a second object.

In this embodiment, the circuit pattern on the reticle 2 is projected and exposed onto the wafer 4, which is coated with a photosensitive material such as a resist, at a magnification of 1/N times (N>1) by a step and scan scheme through the projection lens 3. In the exposure apparatus using the step and scan scheme, the pattern on the reticle 2 is not illuminated all at once, but an illumination area 5 having a slit-like shape is formed. The pattern on the reticle 2 located in the illumination area 5 is transferred onto an exposure area 6 on the wafer 4 through the projection lens 3.

During exposure, the reticle 2 is scanned by relatively moving a reticle stage 7 in the x direction. The wafer 4 is placed on a movable stage 8, and, during exposure, the movable stage 8 is scanned along a guide portion 9 in the −x direction, opposing the x direction movement of the reticle 2. Reference numeral 10 denotes a stage on which the entire portions of the movable stage 8 and the guide portion 9 are placed. The stage 10, together with the movable stage 8 and the guide portion 9, constitute a wafer stage. The reticle 2 and the wafer 4 are synchronously scanned at a speed ratio corresponding to the projection magnification of the projection lens 3, in opposite directions. The scanning speed of the wafer 4 is obtained by multiplying the projection magnification of the projection lens 3 by the scanning speed of the reticle 2.

Reference numeral 11 denotes a light source unit including a light source such as an excimer laser or a high-pressure mercury lamp and a plurality of optical elements. Reference numeral 12 denotes a light-exit portion of a homogenizer (integrator) (not shown) such as a fly's eye array lens. In an actual apparatus, a secondary light source is formed at the position of the light-exit portion 12. The discussion below is made on an assumption that the light-exit portion 12 is considered to be a substantial light source. For this reason, for convenience, the light-exit portion 12 is called a "secondary light source".

An illumination light flux exiting from the secondary light source 12 is incident on the polarization element 41 (polarization means) through a lens 13. The illumination light flux whose polarization state is converted by causing the light flux to pass through the polarization element 41 is guided to a reticle blind 14. The reticle blind 14 has a slit-like opening extending in the y direction, as shown in FIG. 15, to form the slit-like illumination area 5. The light flux from the slit-like opening of the reticle blind 14 illuminates the reticle 2 through a lens 15, a mirror 16, and a condenser lens 17.

In this case, the reticle blind 14 and the reticle 2 are arranged at optically conjugate positions, and the reticle blind 14 or the reticle 2 and the secondary light source 12 have an optical Fourier transform relationship.

In this embodiment, the influence of an asynchronous high-frequency vibration component in synchronous scanning of the reticle 2 and the wafer 4 is corrected by controlling the polarization state of an illumination light flux (projection light flux) illuminating the pattern on the reticle 2, so that the resolution in the scanning direction is made almost equal to the resolution in the direction perpendicular to the scanning direction.

For this reason, the polarization element 41 functions to convert the polarization state of the incident illumination light flux into linear polarized light whose electric field vector has the y direction as a vibration direction (polarization direction). In this case, a polarizing plate or the like having a sufficient transmittance in an area having an exposure wavelength used in a projection exposure apparatus can be used as the polarization element 41.

FIG. 16 is a view for explaining the polarization direction of an illumination light flux on the reticle 2. In FIG. 16, the reticle 2 and the illumination area 5 are the same as those in FIG. 15. Reference numeral 42 denotes an x-y-z coordinate system and shows the reticle 2 in an x-y plane. The illumination area 5 has a slit-like shape extending in the y direction, as described above, and the scanning direction of the reticle 2 is set in the x direction. The polarization direction of the illumination light flux is perpendicular to the scanning direction as indicated by a double-head arrow 43.

The influence of the polarization state of illumination light on a formed image is well known. For example, this influence is described in "Polarization Effect of Illumination Light" [Proc. SPIE 1927 (1993) p.879] or "Examination of Polarization and Edge Effects in Photolithographic Masks using Three-Dimensional Rigorous Simulation" [Proc. SPIE 2197 (1994) p.521] by A. K. Wong and A. R. Neureuther. For this reason, only the influence of polarized illumination light will be described below with reference to several typical examples.

First, the influence of polarized light on a formed image of a cycle pattern is described with reference to FIGS. 17(A) to 17(B-2). In FIG. 17(A), the coordinate system 42 is defined in the same manner as in FIG. 16, and the discussion is made on an assumption that illumination light linearly polarized in a direction shown by arrow 43 is incident on the reticle 2. As patterns on the reticle 2, a cycle pattern 44 having periodicity in the x direction and a cycle pattern 45 having periodicity in the y direction are considered.

In this case, in the cycle patterns 44 and 45, each hatched portion indicates a light-transmitting portion. FIGS. 17(B-1) and 17(B-2) show results obtained such that the light intensity distributions of an image are calculated with respect to a pattern in which the light-transmitting portion satisfies the parameters of the line width=0.3 $\mu$m and pitch=0.6 $\mu$m under the conditions: the NA of the projection lens=0.5; exposure wavelength $\lambda$=248 nm; and the coherence factor of the illumination light $\sigma$=0.4.

FIGS. 17(B-1) and 17(B-2) show the distributions of light intensity in cycle directions at the middle of each of the longitudinal directions of the cycle patterns 44 and 45, respectively. The magnitude of the distribution is standardized such that the entire energy of light passing through the light-transmitting portion has a predetermined value. When the two images are compared with each other, the peak intensities of the images are different from each other by $\Delta I$. It is understood that an image for the cycle pattern 44 is sharper than the image for the cycle pattern 45. More specifically, with the use of linearly polarized illumination, the resolution of a cycle pattern having a repetition direction perpendicular to the polarization direction of the illumination light can be improved.

Figure 18A:
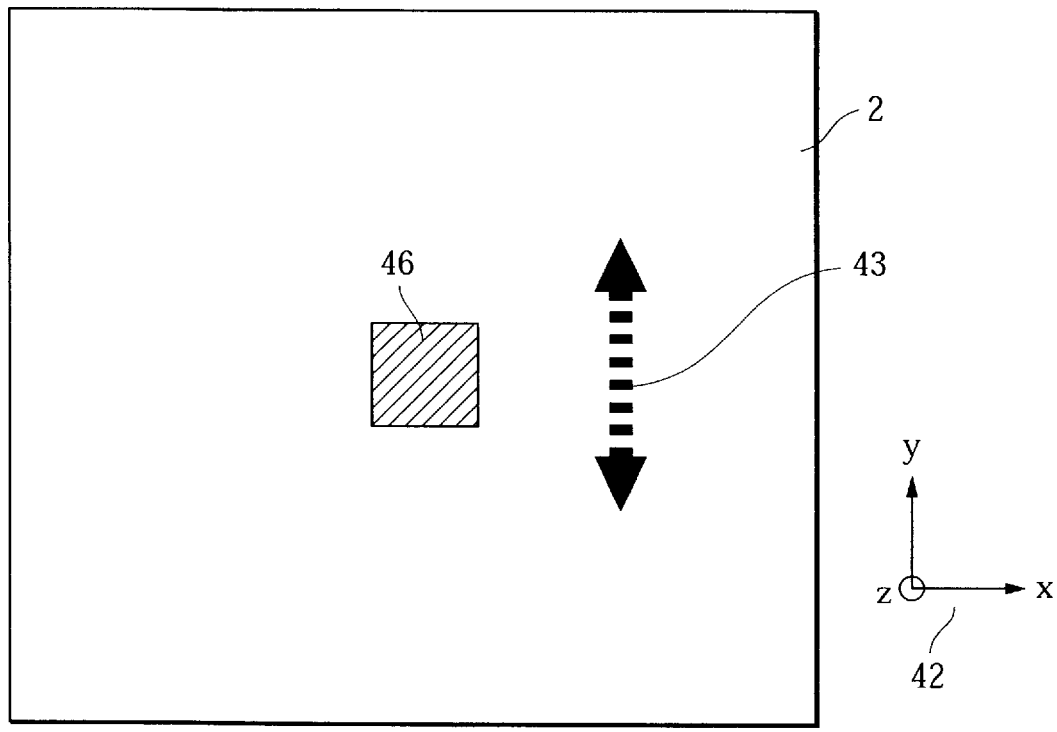
FIGS. 18(A) and 18(B) are views for explaining the relationship between a hole pattern and a polarization state.
Figure 18B:
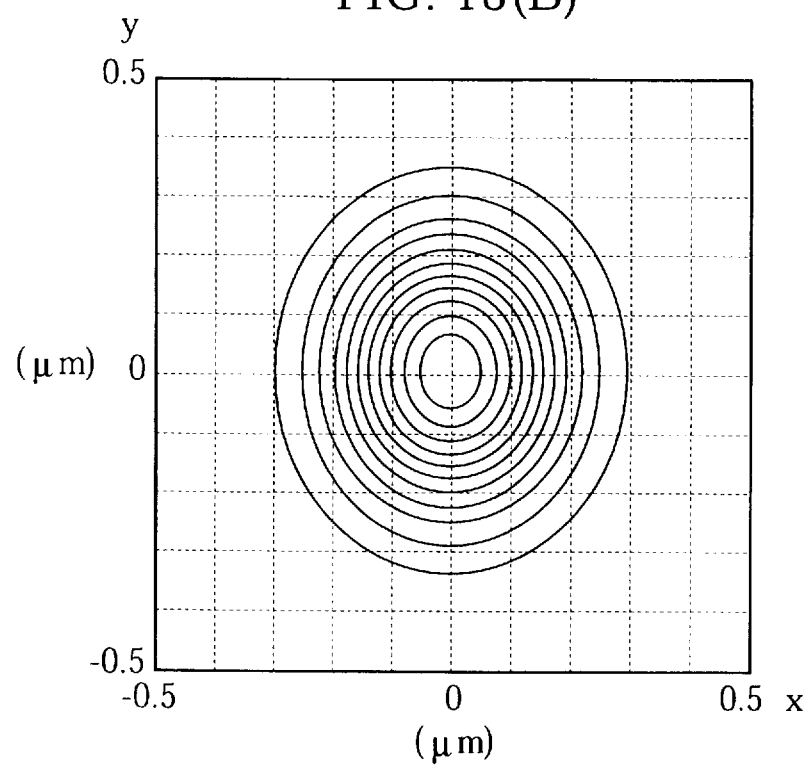

The influence of polarization on an isolated hole pattern will be described below with reference to FIGS. 18(A) and 18(B). As shown in FIG. 18(A), the same assumption as described above, i.e., illumination light linearly polarized in a direction shown by arrow 43 is incident on the reticle 2, is used, and a square pattern 46 is considered. The hatched portion of the pattern 46 is considered to be a light-transmitting portion. FIG. 18(B) shows a result obtained by calculating the light intensity distribution of an image of a 0.5 $\mu$m×0.5 $\mu$m square pattern under the conditions: NA=0.5; $\lambda$=248 nm; and $\sigma$=0.4.

FIG. 18(B) shows the light intensity distribution by contour lines in the x-y plane. In this case, it is understood that the light intensity distribution is extended in the y direction, i.e., the polarization direction 43 of the illumination light, and that a sharp distribution shape can be obtained in the x direction.

As described above with reference to FIGS. 13(A) through 14(B-3), in the arrangement in which an entire pattern on the reticle surface is transferred onto a wafer surface by synchronous scanning of the reticle and wafer, a high-frequency asynchronous vibration is generated in the scanning direction to extend the image in the scanning direction, thereby degrading the resolution. As a result, a resolution in the scanning direction is apparently more degraded than a resolution in the direction perpendicular to the scanning direction, and a pattern to be transferred onto the wafer cannot easily be controlled in size.

For this reason, according to this embodiment, the pattern is illuminated by illumination light linearly polarized in the direction parallel to a slit-like illumination area, i.e., the direction perpendicular to the scanning direction to make the resolutions in both directions almost equal to each other.

As described above with reference to FIGS. 17(A) through 17(B-2), when polarized illumination is performed, as in this embodiment, an image for the repetitive pattern in the x direction is sharper than the image for the repetitive pattern in the y direction.

As described above with reference to FIGS. 18(A) and 18(B), the hole pattern is extended in the y direction to be sharpened in the x direction. However, these calculations are made without considering the influence of vibration caused by scanning. More specifically, these images are obtained when synchronous control in scanning is ideally performed. In fact, the influence of image extension in the scanning direction caused by scanning affects the pattern image in the x direction. As a result, improvement of the resolution in the scanning direction obtained by polarized illumination and degradation of the resolution in the scanning direction caused by vibration in scanning cancel each other out, thereby correcting the directional dependency of the image. More specifically, this embodiment is designed to form an ideal pattern image on a wafer in consideration of the extension of the image in the scanning direction caused by scanning.

The calculations in FIGS. 17(A) to 17(B-2) are made on an assumption that the line widths of the cycle patterns in the x and y directions are equal to each other. More specifically, as shown in FIG. 5, the pitch p and line width d of the pattern in the x direction are set to be equal to those of the pattern in the y direction.

As described above, a sharp image can be obtained for the cycle pattern in the x direction by using polarized illumination. For this reason, as shown in FIG. 6, although the pitches p in the x and y directions are made equal to each other, a line width f in the x direction (scanning direction) is made smaller than the line width d in the y direction. More specifically, patterns which satisfy f<d can be used. The directional dependency of the resolution can be more accurately corrected. The ratio of the line width d to the line width f is determined in consideration of the magnitude of asynchronous high-frequency vibration generated by scanning.

Similarly, with respect to a hole pattern having the equal dimensions h in the x and y directions, as shown in FIG. 7, the dimension h can be changed into a dimension j in the x direction (scanning direction) (j<h), as shown in FIG. 8. In this manner, distortion of an image shape can be accurately corrected. In this case, the ratio of h to j is determined in consideration of the magnitude of asynchronous high-frequency vibration caused by scanning.

The above embodiment is a case wherein the polarization element 41 is inserted immediately before the reticle blind 14, and a pattern on a reticle is illuminated by linearly polarized illumination light. However, an influence of polarization on a focused image is not essentially dependent on the polarization state of illumination light illuminating the pattern, but is essentially dependent on the polarization state of light fluxes for forming the image. In this sense, the polarization element 41 can be set at any position between the light source unit 11 and the wafer 4.

In the above description of this embodiment, the entire illumination area on the reticle is illuminated by linearly polarized illumination light. However, if desired, only a portion of the reticle affected by an asynchronous high-frequency component generated by scanning may be illuminated by linearly polarized light.

Figure 19:
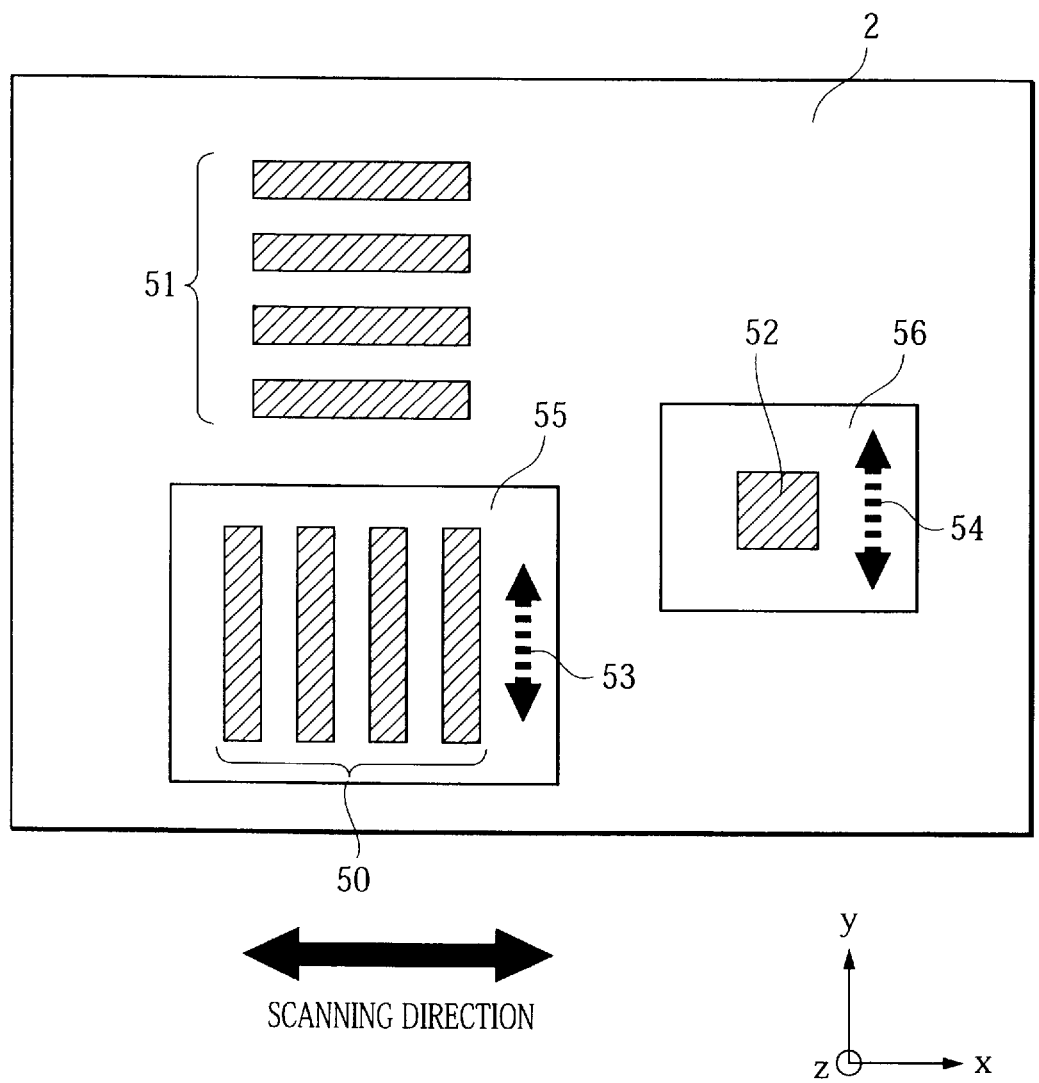
FIG. 19 is a view for explaining the control of a polarization state on a second object surface.

For example, as shown in FIG. 19, when a cycle pattern 50 in the x direction, a cycle pattern 51 in the y direction, and a hole pattern 52 are formed on the reticle 2, the cycle pattern 51 is rarely affected by vibration in the scanning direction. Therefore, the polarization directions of light selectively illuminating the cycle pattern 50 and the hole pattern 52 are represented by arrows 53 and 54. For this purpose, small polarizing plates 55 and 56, through which pass only the polarized components in the directions of the arrows 53 and 54, are arranged on the corresponding patterns on the reticle 2.

This embodiment has been described based on the assumption that the illumination light is completely linearly polarized. In order to correct the influence of vibration in the scanning direction, a correction amount in accordance with the magnitude of the vibration may also be performed by adjusting the polarization state of the illumination light, i.e., by using polarized light.

Figure 20:
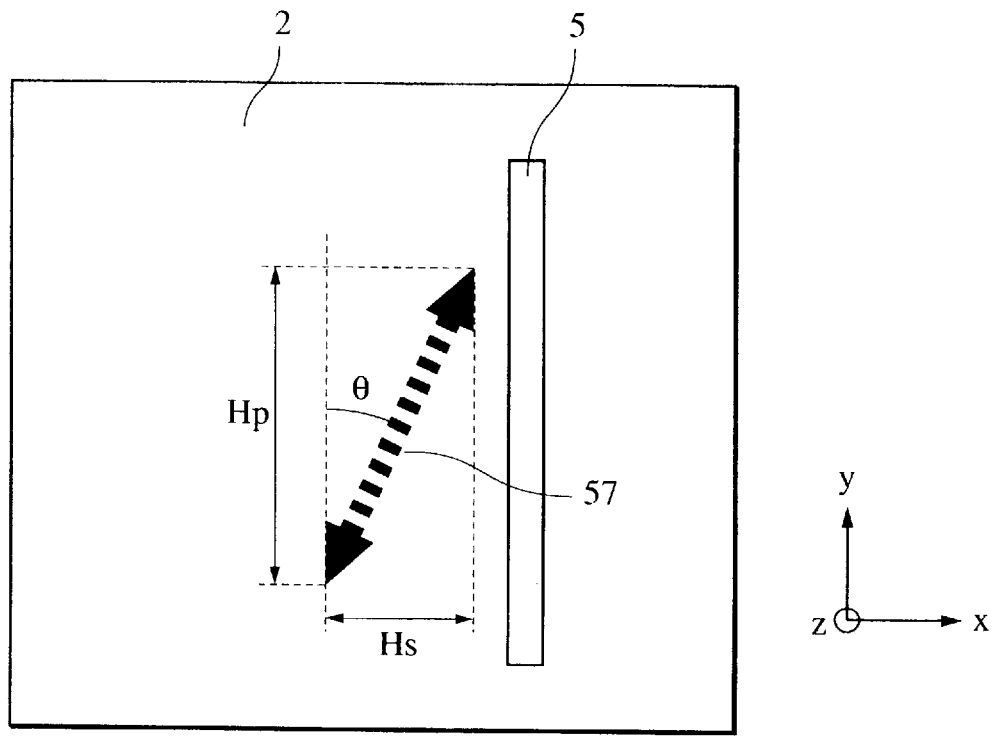
FIG. 20 is a view for explaining the control of a polarization state in the second embodiment.

The first method will be described below with reference to FIG. 20. FIG. 20 shows the relationship between the illumination area 5 on the reticle 2 and the polarization direction of the illumination light as in FIG. 16. In this case, the polarization direction of the linear polarization indicated by a double-head arrow 57 is inclined from the direction (y direction) perpendicular to the scanning direction by an angle θ, and the angle θ is selected in accordance with the magnitude of vibration in the scanning direction, so that optimum correction can be performed. The range of the angle θ in which the influence of vibration can be corrected is limited to the range of "−45°<θ<45°". When this is expressed by a magnitude Hs of a polarization component in the scanning direction and a magnitude Hp of a polarization component in the direction perpendicular to the scanning direction, "Hp>Hs" should be satisfied.

Figure 21:
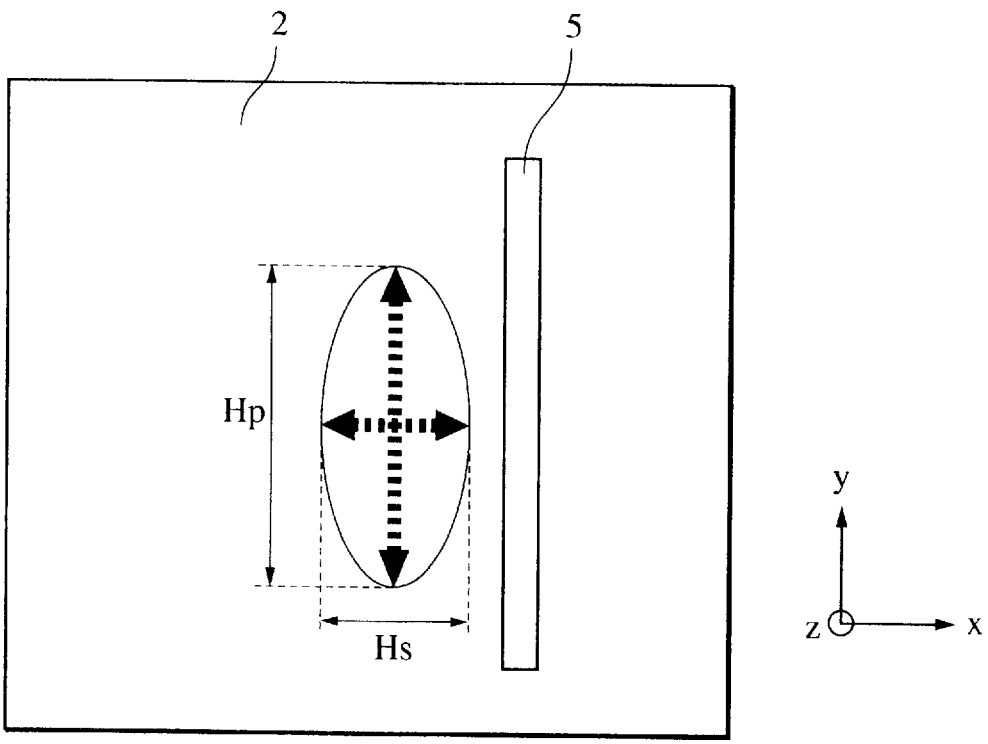
FIG. 21 is a view for explaining the control of a polarization state in the second embodiment.

The second method will be described below with reference to FIG. 21. Referring to FIG. 21, as a characteristic feature, elliptically polarized light or partially polarized light is used as illumination light in place of linearly polarized light. In this case, when the magnitude of the polarization component in the scanning direction is represented by Hs, and the magnitude of the polarization component in the direction perpendicular to the scanning direction is represented by Hp, the ratio of Hs to Hp is adjusted in the range of "Hp>Hs". In this manner, the same correction as described above can be performed.

In the above description, a polarization element for converting the polarization state of the light flux is arranged in an optical system to provide an optimum polarization state for imaging a pattern. In an excimer laser or the like which has been popularly used as a light source in recent years, a light flux emitted from a laser generally has considerable polarization characteristics. When a suitable polarization state can be obtained using such a laser, in accordance with the principles of this invention, a special polarization element or the like for converting the polarization state is not required.

In addition, a light source such as a laser emitting polarized light and a polarization element capable of adjusting the polarization state of the polarized light may be used at the same time. In this manner, an optimum polarization state can be easily realized.

The above description has been made on the assumption that degradation of an image in the direction perpendicular to the scanning direction is larger than that in the direction parallel to the scanning direction due to the influence of vibration generated by scanning. In fact, in a typical exposure apparatus, the degradation of an image in the scanning direction conspicuously appears. However, when the influence of vibration in the direction perpendicular to the scanning direction is relatively large under some special conditions, the polarization direction of the illumination light may be determined to be in the direction perpendicular to the direction described in this embodiment.

Figure 22:
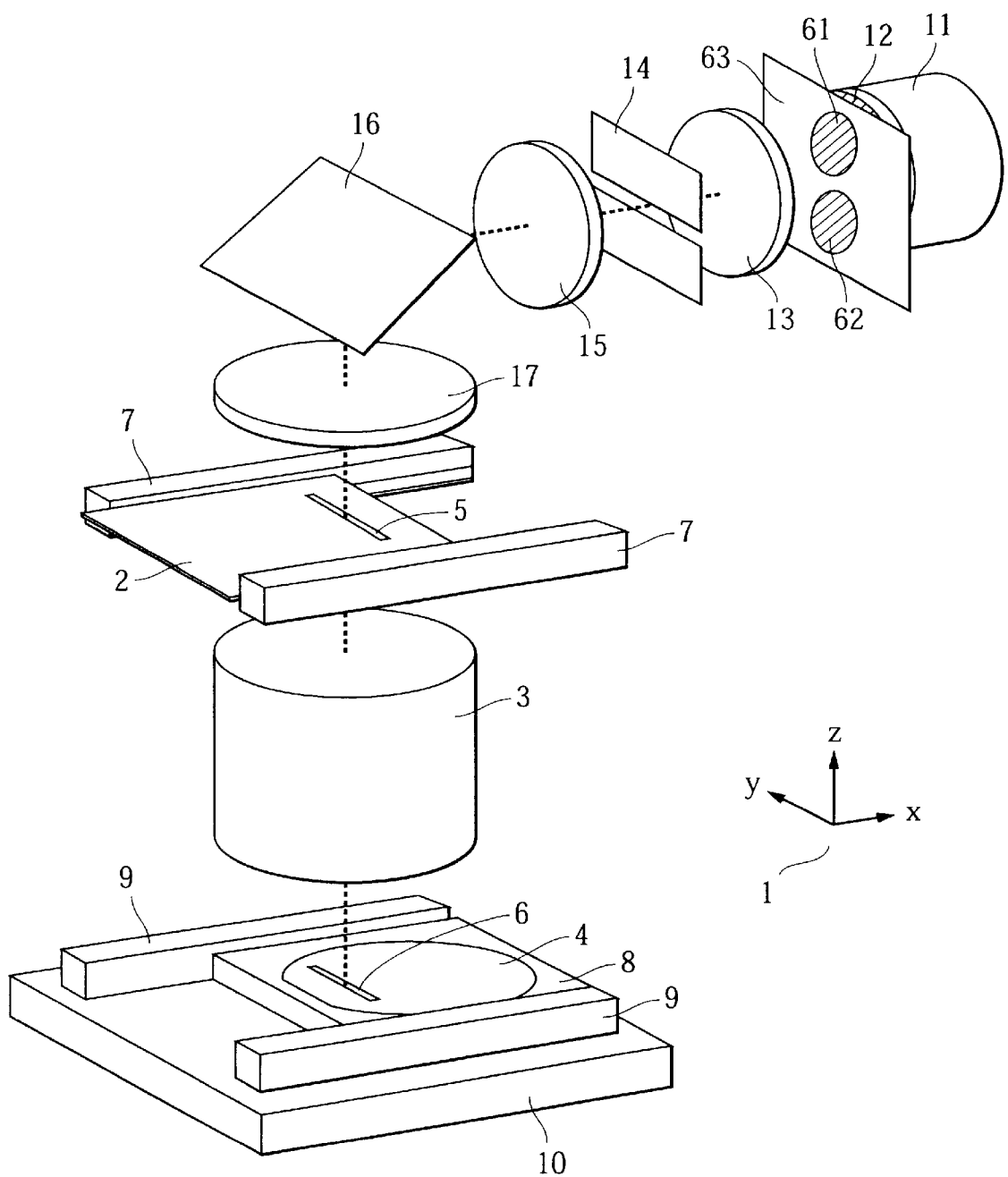
FIG. 22 is a schematic view showing a main portion of the third embodiment of the present invention.
Figure 23:
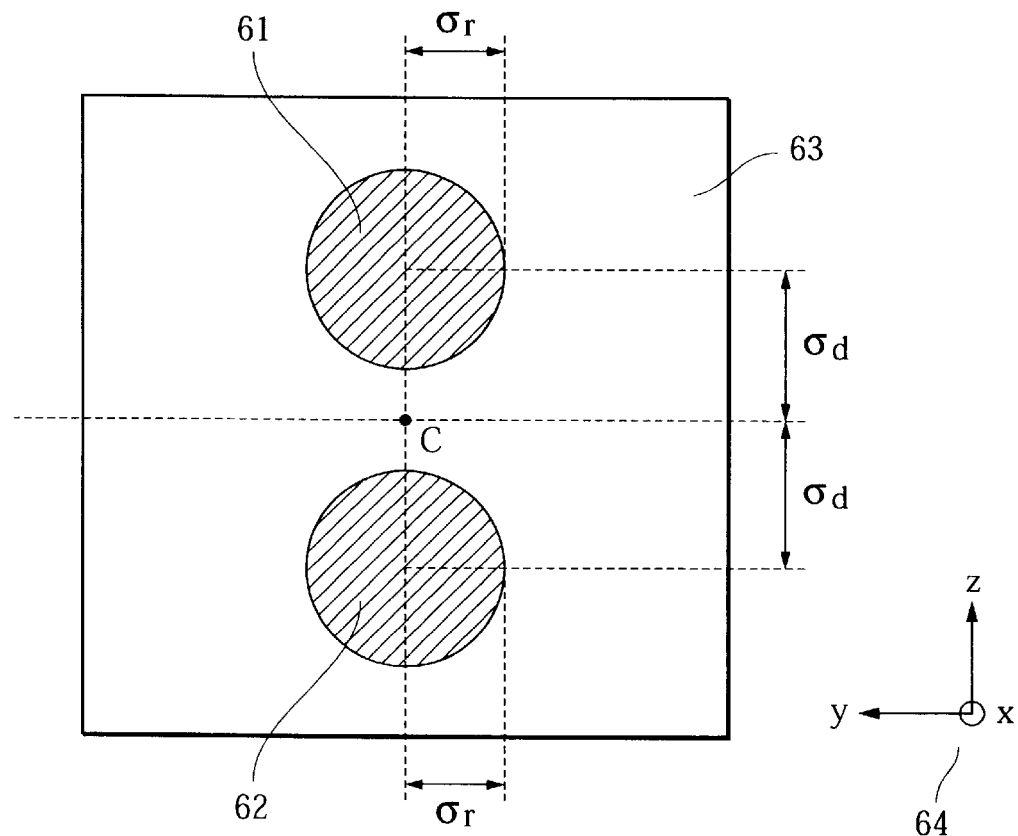
FIG. 23 is a view for explaining a portion of FIG. 22.
Figure 24:
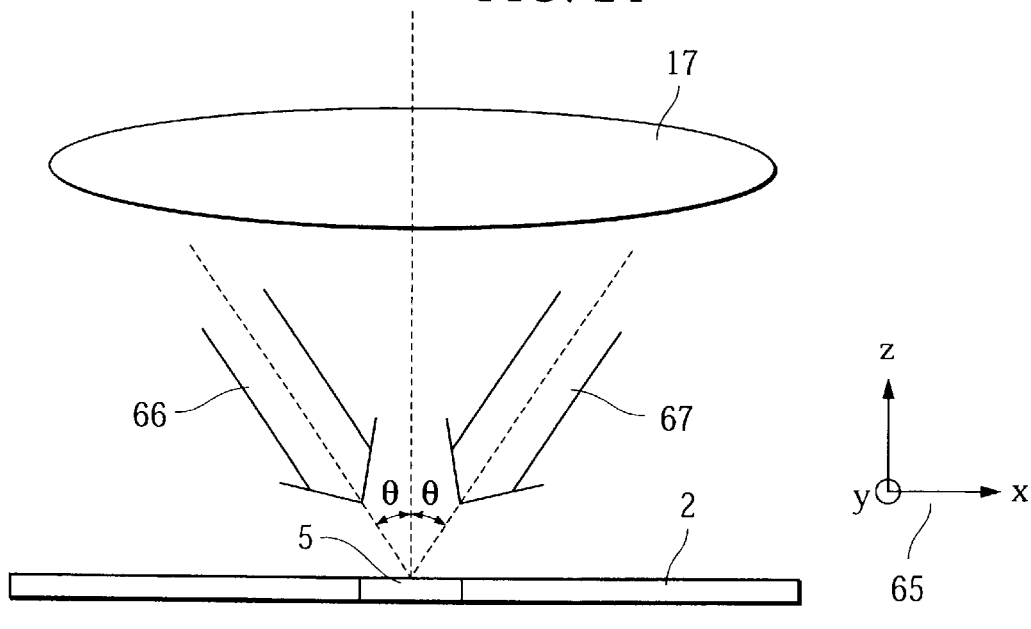
FIG. 24 is a view for explaining another portion of FIG. 22.

FIG. 22 is a schematic view showing a main portion of the third embodiment of the present invention, and FIGS. 23 and 24 are views for explaining portions of FIG. 22. This embodiment has the same arrangement as that of the first embodiment shown in FIG. 1 except that a conventional circular aperture diaphragm is arranged at a pupil position 18 of a projection lens 3, and an aperture 63 having a predetermined opening is arranged between a secondary light source 12 and a lens 13 to adjust incident conditions of an illumination light flux onto a first object surface. The respective elements in this embodiment will be described below, although this description partially overlaps the description of FIG. 1.

Referring to FIG. 22, reference numeral 2 denotes a reticle on which a circuit pattern, serving as a first object, is drawn; 3, a projection lens (projection optical system mirror (or a combination of a lens and a mirror)); and 4, a semiconductor wafer (e.g., a silicon wafer) serving as a second object.

In this embodiment, the circuit pattern on the reticle 2 is projected and exposed onto the wafer 4, which is coated with a photosensitive material such as a resist, at a magnification of 1/N times (N>1) by a step and scan scheme through the projection lens 3. In the exposure apparatus using the step and scan scheme, the pattern on the reticle 2 is not illuminated all at once, but an illumination area 5 having a slit-like shape is formed. The pattern on the reticle 2 located in the illumination area 5 is transferred onto an exposure area 6 on the wafer 4 through the projection lens 3.

During exposure, the reticle 2 is scanned by relatively moving a reticle stage 7 in the x direction. The wafer 4 is placed on a movable stage 8, and, during exposure, the movable stage 8 is scanned along a guide portion 9 in the −x direction, opposing the x direction movement of the reticle 2. Reference numeral 10 denotes a stage on which the entire portions of the movable stage 8 and the guide portion 9 are placed. The stage 10, together with the movable stage 8 and the guide portion 9, constitute a wafer stage. The reticle 2 and the wafer 4 are synchronously scanned at a speed ratio corresponding to the projection magnification of the projection lens 3 in opposite directions. The scanning speed of the wafer 4 is obtained by multiplying the projection magnification of the projection lens 3 by the scanning speed of the reticle 2.

Reference numeral 11 denotes a light source unit including a light source such as an excimer laser or a high-pressure mercury lamp and a plurality of optical elements. Reference numeral 12 denotes a light-exit portion of a homogenizer (integrator) (not shown) such as a fly's eye array lens. In an actual apparatus, a secondary light source is formed at the position of the light-exit portion 12. The discussion below is made on an assumption that the light-exit portion 12 is considered to be a substantial light source. For this reason, for convenience, the light-exit portion 12 is called a "secondary light source".

An illumination light flux exiting from the secondary light source 12 is emitted from openings 61 and 62 of an aperture 63 in which the openings 61 and 62 are formed sufficiently close to each other as though light fluxes radiated from a light source unit having two light sources 61 and 62 are incident on the lens 13.

In this embodiment, the openings 61 and 62 are considered to be light sources and are called light sources 61 and 62 hereinafter. The light fluxes from the light sources 61 and 62 are guided to a reticle blind 14 by a lens 13. The reticle blind 14 has a slit-like opening extending in the y direction as shown in FIG. 22, to provide a slit-like illumination area 5. The light flux from the slit-like opening of the reticle blind 14 illuminates the reticle 2 through a lens 15, a mirror 16, and a condenser lens 17. In this case, the reticle blind 14 and the reticle 2 are arranged at optically conjugate positions.

In this embodiment, when a secondary light source or a light source unit having different intensity distributions in the z and y directions is used to illuminate a pattern on the reticle 2, different illuminating operations are performed to the pattern in the scanning direction (the x direction) and the direction (the y direction) perpendicular to the scanning direction so as to make the resolution in the scanning direction almost equal to the resolution in the direction perpendicular to the scanning direction. In this case, as is apparent from FIG. 22, the z direction at the position of the light sources 61 and 62 is converted into the x direction on the reticle 2, i.e., the scanning direction, by the mirror 16.

FIG. 23 is an enlarged view showing the light sources 61 and 62 and the aperture 63 for providing the light sources 61 and 62. As indicated by an x-y-z coordinate system 64, the light sources 61 and 62 and the aperture 63 are illustrated in a y-z plane. Each of the light sources 61 and 62 has a circular shape. Reference symbol $\sigma_r$ denotes the radius of each of the circular light sources 61 and 62; and $\sigma_d$, a shift amount of the center of each of the light sources 61 and 62 from a center (corresponding to an optical axis) C of the aperture 63.

In a conventional projection exposure apparatus, a secondary light source or a light source unit is simply constituted by one circle. However, in recent years, an effort has been made to variably modify the secondary light source or the light source unit so as to increase the resolution of the projection exposure apparatus. This is known as a "modified illumination" technique. A basic idea related to this technique is described in detail in Proc. SPIE 1674 Optical/Laser Microlithography V, p. 92 (1992).

The arrangement shown in FIG. 23 is a so-called double-pole illumination, and, as will be described later, has an effect that the resolution of a pattern having a repetitive cycle in a specific direction is improved.

Illumination light fluxes obtained in this embodiment will be described below with reference to FIG. 24. With reference to x-y-z coordinate system 65, the reticle 2, the illumination area 5, and the condenser lens 17 are shown in an x-z plane. The light flux emitting from the light source 61 (FIG. 23) is incident on the condenser lens 17 through the lens 13 to the mirror 16 as described above with respect to FIG. 22. The light flux passes through the condenser lens 17, and then obliquely illuminates the illumination area 5 as an illumination light flux 66. Similarly, the light flux emitted from the light source 62 (FIG. 23) obliquely illuminates the illumination area 5 as an illumination light flux 67. An angle θ between each of the illumination light fluxes 66 and 67 and the optical axis of the lens 17 (in the z direction) can be adjusted by changing the shift amount ad shown in FIG. 23.

As used herein, the angle θ means the incident angle of the illumination light flux—i.e., the angle in the center of mass of the light intensity distribution.

FIG. 24 shows the illumination light fluxes 66 and 67 in the x-z plane. When the illumination light fluxes 66 and 67 are shown in the y-z plane, these light fluxes (the center of mass) have no inclination with respect to the z direction, and are vertically incident on the reticle 2.

The manner that the resolution is changed by the illumination light fluxes from oblique directions will be described below. For this purpose, the pattern shown in FIG. 25 is assumed. With reference to x-y-z coordinate system 68, the reticle 2 is shown in the x-y plane in FIG. 25. In this case, imaging for a cycle pattern 69 having periodicity in the x direction and imaging for a cycle pattern 70 having periodicity in the y direction are assumed. The hatched portions indicate light-transmitting portions, respectively.

The conditions are set as follows: the NA of the optical system=0.6; the wavelength λ of the exposure light=0.365 μm; the pattern line width=0.33 μm; the pattern pitch=0.66 μm; and $\sigma_r$=0.16. Under these conditions, the images of the patterns 66 and 67 obtained when $\sigma_d$ is changed are compared with each other. The values of $\sigma_r$ and $\sigma_d$ are not indicated by the actual sizes of the light sources 61 and 62, but by values of the projection lens 3 normalized by the aperture size as in a conventional manner.

FIGS. 26(A-1) to 26(C-2) are graphs for explaining calculation results obtained under these conditions. Calculation is performed in three cases, i.e., $\sigma_d$=0, 0.2, and 0.3. FIGS. 26(A-1) to 26(C-2) show light intensity distributions of images in the repetitive directions of the patterns. Each distribution is standardized such that a value obtained by integrating all intensities becomes a predetermined value. FIGS. 26(A-1), 26(B-1), and 26(C-1) show the light intensity distributions of the image of the pattern 69, respectively, and FIGS. 26(B-1), 26(B-2), and 26(C-2) show the light intensity distributions of the image of the pattern 70, respectively.

In the case of $\sigma_d$=0, illumination conditions for the pattern 69 are the same as those for the pattern 70. For this reason, the distributions in FIGS. 26(A-1) and 26(A-2) have no difference. When $\sigma_d$=0.2 and $\sigma_d$=0.3, the distributions are different from each other as is apparent from FIGS. 26(B-1) to 26(C-2). The intensity distribution in FIG. 26(B-1) is sharper than the intensity distribution in FIG. 26(B-2), and the intensity distribution in FIG. 26(C-1) is sharper than the intensity distribution in FIG. 26(C-2).

In FIGS. 26(A-1) to 26(C-2), a comparison is conveniently performed by using a difference ΔI between peak intensities. It is apparent that the images in FIGS. 26(B-1) and 26(C-1) are excellent even when the comparison is made by using contrasts. In this embodiment, the resolution is changed depending on the direction of a pattern by controlling the light sources 61 and 62 as described above.

In the step and scan projection exposure apparatus, as described above, the resolution of a pattern having a repetitive cycle in the scanning direction (the x direction) is degraded due to the influence of an asynchronous high-frequency vibration component generated when the reticle 2 and the wafer 4 are synchronously scanned.

In this embodiment, in order to solve the above problem, degradation of an image caused by scanning is corrected by an illumination method for a pattern. In FIGS. 26(A-1) to 26(C-2), the changes of the resolutions of the patterns caused by the illumination method are calculated without considering vibration caused by scanning. However, when degradation of an image caused by vibration generated by scanning is considered, conditions under which equal resolutions can be obtained in the scanning direction (the x direction) and the direction (the y direction) perpendicular to the scanning direction can be calculated.

The values $\sigma_r$ and $\sigma_d$ used in this embodiment are totally determined in consideration of the magnitude of asynchronous high-frequency vibration generated by scanning.

The calculations shown in FIGS. 26(A-1) to 26(C-2) are made on the assumption that the line widths of the cycle patterns in the x and y directions are equal to each other.

As described above, a sharp image can be obtained for the cycle pattern in the x direction by using the modified illumination according to this embodiment. For this reason, as shown in FIG. 6, the pitches p are set to be equal to each other in the x and y directions, and the line width f in the x direction (scanning direction) is set to be smaller than the line width d in the y direction, i.e., a pattern which satisfies f<d is used, thereby making it possible to more accurately correct the directional dependency of resolution. In this case, the ratio of the line width d to the line width f is totally determined in consideration of the magnitude of asynchronous high-frequency vibration generated by scanning.

Although the above description is related to the directional dependency of resolution of a cycle pattern, even for an isolated hole pattern described with respect to FIGS. 13(A) and 13(B), the influence of asynchronous high-frequency vibration generated by scanning can be corrected to some extent by the following method. That is, as shown in FIG. 8, the original pattern is contracted in the scanning direction such that the length in the scanning direction represented by j, and the length in the direction perpendicular to the scanning direction represented by h, satisfy the relationship "j<h".

A light source other than the "doublepole" light source shown in FIG. 23 will be described below with reference to FIGS. 27(A) to 30(B). In this case, a light source is shown as an opening shape on the aperture 63 on the y-z plane, based on the coordinate system 64 shown in FIG. 23. In this case, the extension size of the light source shape in the z direction corresponds to the magnitude of an oblique component of illumination light on the illumination area of the reticle in a plane (x-z plane) including the scanning direction.

The extension size of the light source shape in the y direction corresponds to the magnitude of an oblique component of illumination light on the illumination area of the reticle in a plane (y-z plane) including the direction perpendicular to the scanning direction.

The third embodiment seeks to solve the problem that the image of a repetitive pattern in the scanning direction is degraded by the influence of an asynchronous vibration component generated by scanning. For this purpose, the resolution of the pattern in the scanning direction is selectively improved to correct the influence of the asynchronous high-frequency vibration component.

The basic principle of the "modified illumination" is to increase the resolution by illuminating the cycle pattern in an oblique direction.

In order to selectively improve the resolution of the repetitive pattern in the scanning direction, the light source preferably has a shape which is extended substantially in the z direction. In this manner, degradation of the image caused by the asynchronous high-frequency vibration component generated by scanning can be corrected.

FIGS. 27(A) and 27(B) show an application to general illumination. Assume that an original light source shape (circular shape) is represented by hatched portion 71 in FIG. 27(A). In this case, the shape is extended in the z direction as shown in FIG. 27(B), and, by light source 72, the resolution of the cycle pattern in the scanning direction can be selectively improved by satisfying the following condition:

α<β.

In this case, the ratio of α to β is determined on the basis of the magnitude of vibration generated by scanning in an actual apparatus. According to the method shown in FIGS. 27(A) and 27(B), the numerical aperture (NA) of an illumination system in the scanning direction (the x direction) is made different from that in the direction (the y direction) perpendicular to the scanning direction. As is apparent from FIG. 27(B), the NA in the scanning direction (the x direction) is set to be larger than the NA in the direction (the y direction) perpendicular to the scanning direction.

Figure 28A:
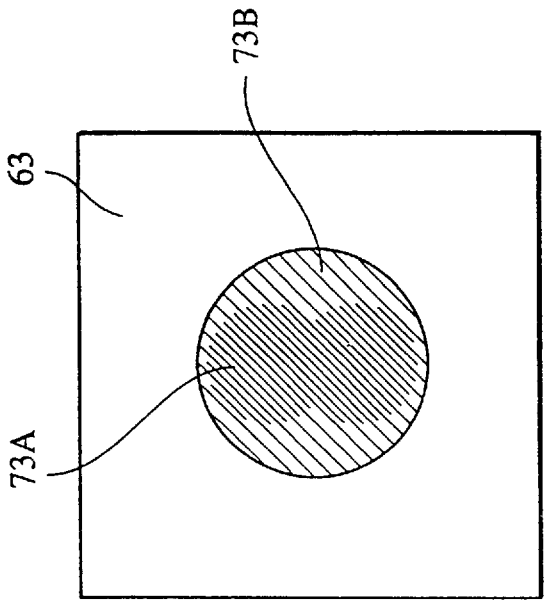
FIGS. 28(A) and 28(B) are views for explaining another aperture according to the third embodiment.
Figure 28B:
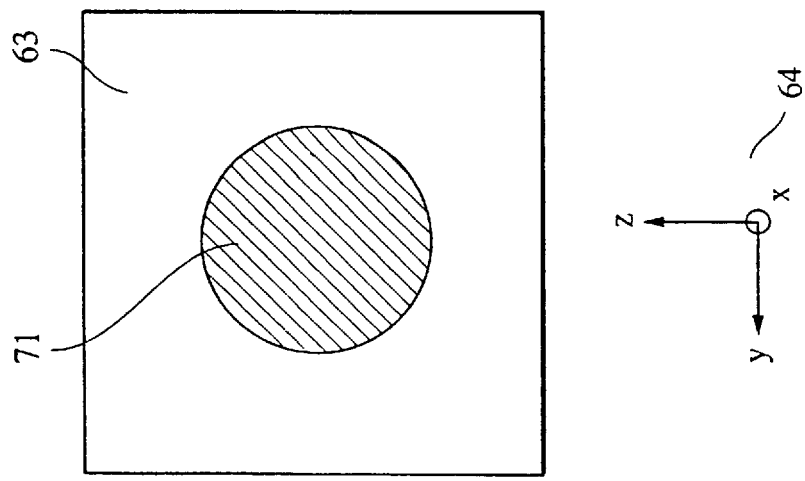

Referring to FIGS. 28(A) and 28(B), the light source having a uniform light intensity distribution and shown in FIG. 28(A) is weighted as shown in FIG. 28(B) to provide the same effect as described above. A hatched portion 73A shown in FIG. 28(B) indicates a portion having a light intensity higher than a roughly hatched portion 73B around the hatched portion 73A. When a distribution is set such that the portion having a high light intensity is extended, the resolution of the cycle pattern in the scanning direction can be selectively improved.

Figure 29A:
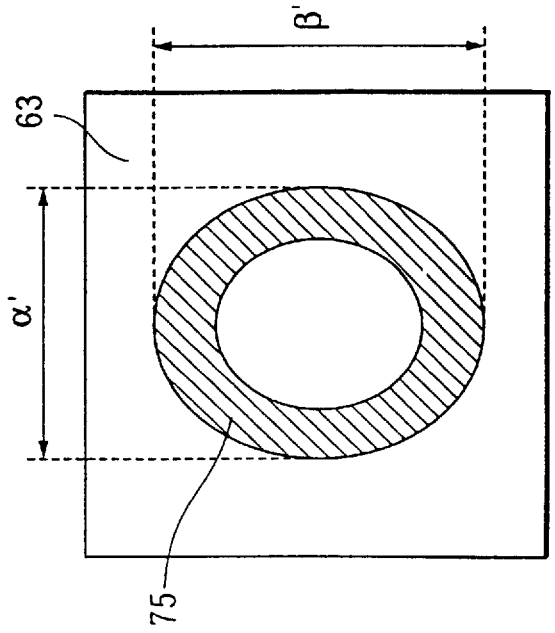
FIGS. 29(A) and 29(B) are views for explaining still another aperture according to the third embodiment.
Figure 29B:
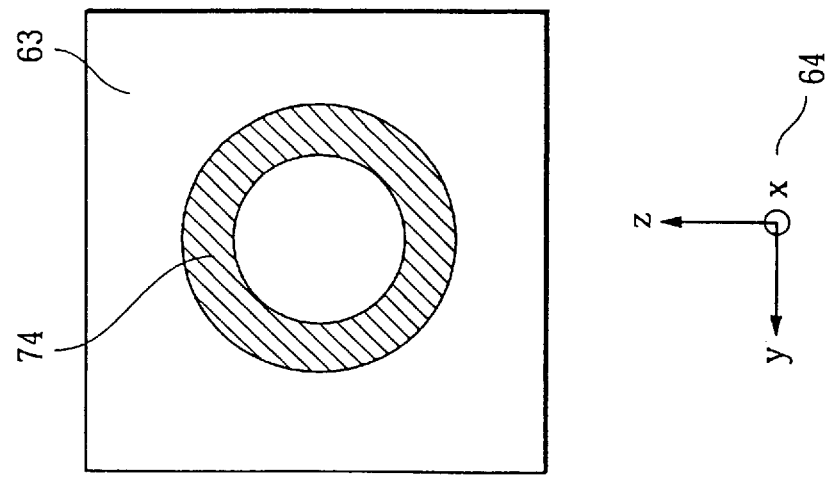

The light source shown in FIGS. 29(A) and 29(B) is obtained by modifying the light source of the third embodiment into a "ring illumination" serving as a typical modified illumination. It is known that the shape of the light source can be changed into a ring-like shape 74 to improve the resolutions of cycle patterns in all directions on the reticle. In this case, in order to selectively further improve the resolution of the repetitive pattern in the scanning direction, the ring-like shape 74 may be extended in the z direction as shown in FIG. 29(B) to obtain a light source 75 which satisfies the following relationship:

α'<β'.

The ratio of α' to β' is determined on the basis of the magnitude of vibration generated by scanning in an actual apparatus.

Figure 30B:
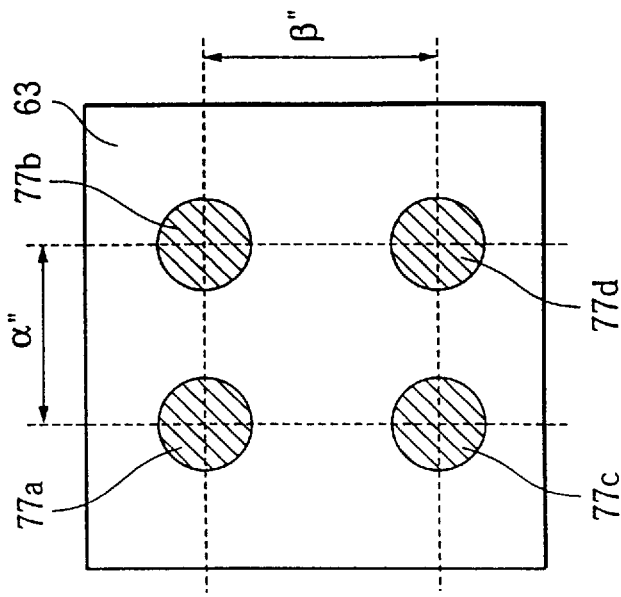
FIGS. 30(A) and 30(B) are views for explaining still another aperture according to the third embodiment.
Figure 30A:
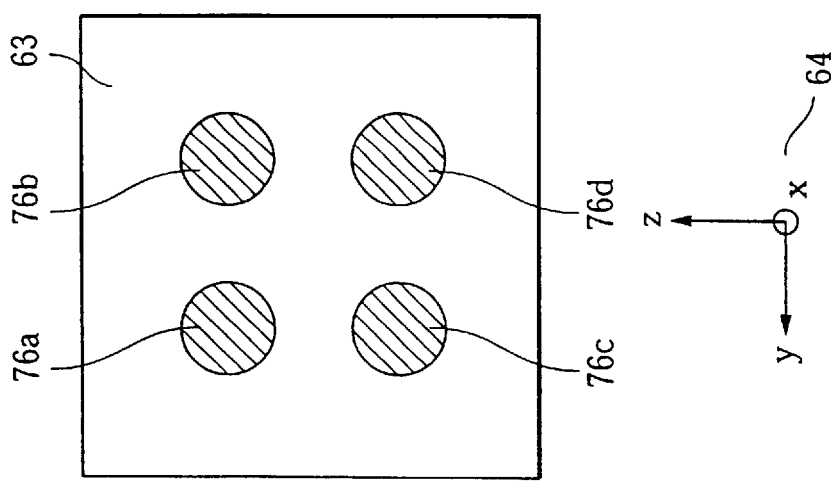

FIGS. 30(A) and 30(B) show another typical modified illumination which is obtained by modifying the light source into a "quadruple illumination". When the light source is divided into four portions 76a to 76d as shown in FIG. 30(A), the resolutions of the repetitive patterns in the x direction (the scanning direction) and the y direction (the direction perpendicular to the scanning direction) can be improved. In this case, in order to selectively further improve the resolution of the repetitive pattern in the scanning direction, the four portions 76a to 76d may be extended in the z direction as shown in FIG. 30(B) to obtain light sources 77a to 77d whose intervals satisfy the following relationship:

α"<β".

In this case, the ratio of α" to β" is determined on the basis of the magnitude of vibration generated by scanning in an actual apparatus.

Finally, the above description has been made on the assumption that the degradation of the image in the scanning direction is greater than that in the direction perpendicular to the scanning direction due to the influence of vibration generated by scanning. In fact, in a typical exposure apparatus, the influence of degradation of an image in the scanning direction conspicuously appears. However, when the influence of vibration in the direction perpendicular to the scanning direction is relatively large, under some special conditions, the shape of the light source may be modified in the direction perpendicular to the direction described in this embodiment.

Figure 31:
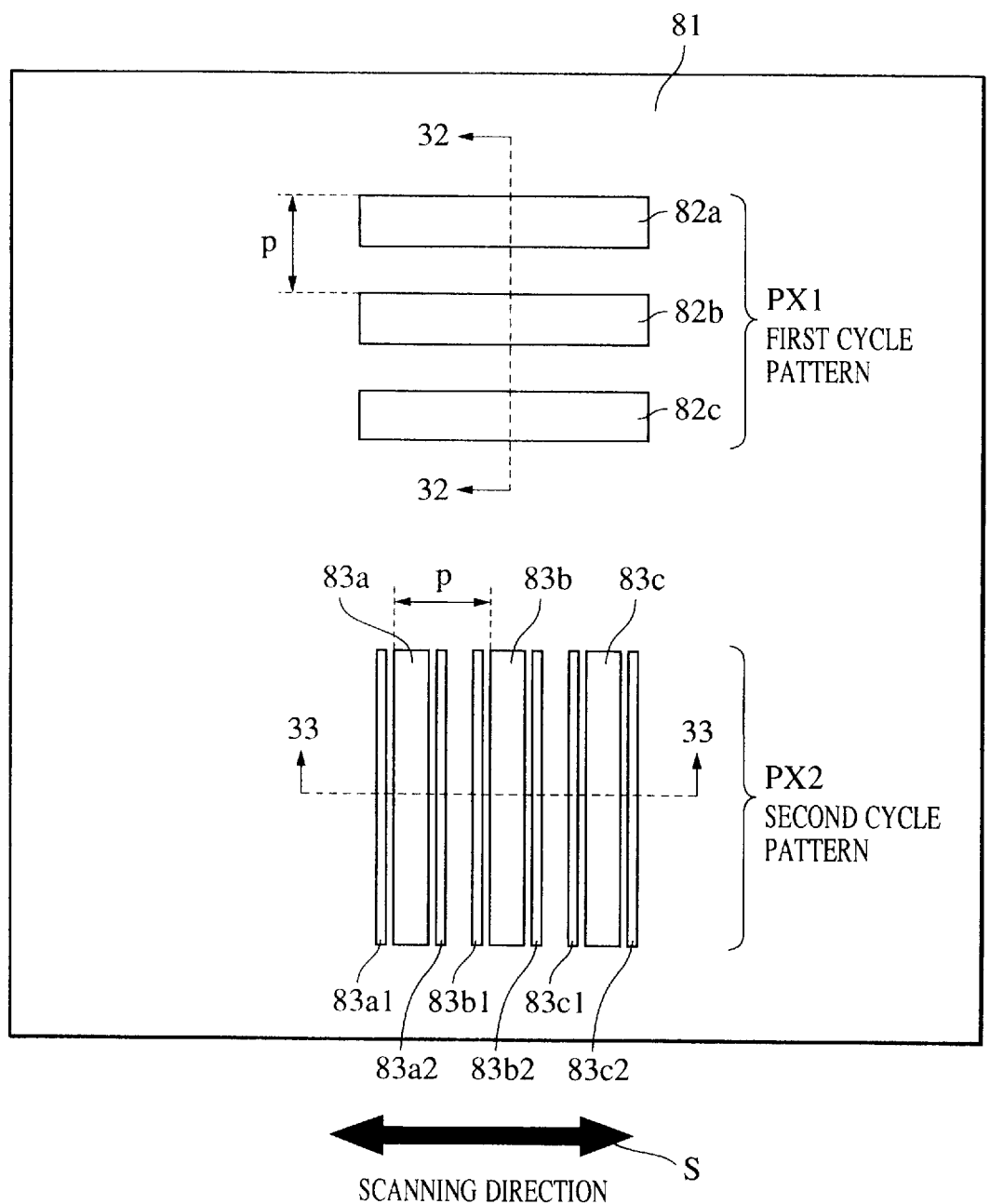
FIG. 31 is a schematic view showing a main portion of a reticle according to the fourth embodiment of the present invention.

FIG. 31 is a schematic view showing a main portion of the fourth embodiment of the present invention. Referring to FIG. 31, reference numeral 81 denotes an entire reticle. The pattern on the reticle 81 has a first cycle pattern PX2 constituted by openings 82a, 82b, and 82c and a second cycle pattern PX1 constituted by openings 83a, 83b, and 83c.

More complicated patterns are arranged on an actual reticle used in the manufacture of a semiconductor element. In the description of this embodiment, the actual complicated patterns are represented by the first and second cycle patterns. In this case, the first and second cycle patterns PX1 and PX2 have equal pitches p, and optical images having equal pitches are formed on the basis of these patterns.

A double-head arrow S indicates a scanning direction of the reticle 81 when it is applied to a step and scan exposure apparatus. The first cycle pattern PX1 has periodicity in the direction perpendicular to the scanning direction, and the second cycle pattern PX2 has periodicity in the same direction as the scanning direction S.

The reticle 81 according to this embodiment includes phase-shift portions 83a1, 83a2, 83b1, 83b2, 83c1, and 83c2 serving as means for improving only the resolution of the second cycle pattern PX2 and having periodicity in the scanning direction, so that the resolution in the scanning direction is made equal to the resolution in the direction perpendicular to the scanning direction.

Figure 32:
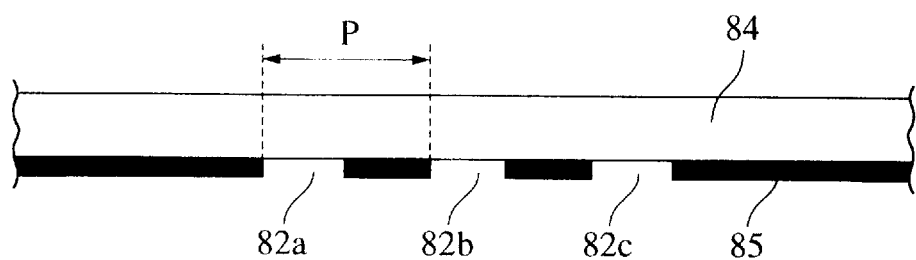
FIG. 32 is a sectional view showing the reticle along a sectional line 32—32 in FIG. 31.
Figure 33:
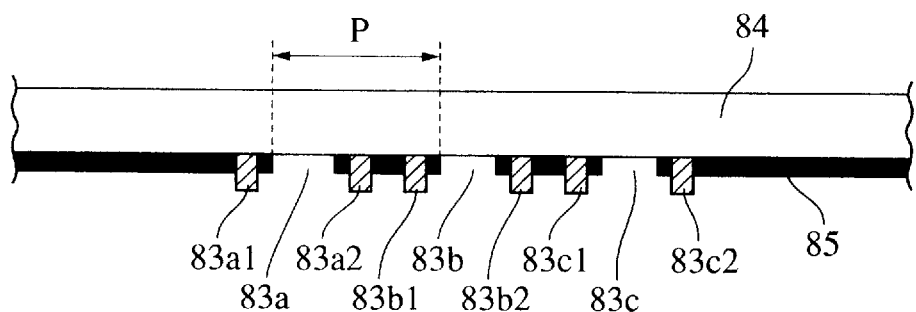
FIG. 33 is a sectional view showing the reticle along a sectional line 33—33 in FIG. 31.

In order to describe the difference between the first and second cycle patterns, FIG. 32 shows the arrangement of a section of a reticle along the repetitive direction (indicated by section lines 32—32 in FIG. 31) of the first cycle pattern PX1, and FIG. 33 shows the arrangement of a section along the repetitive direction (indicated by section lines 33—33 in FIG. 31) of the second cycle pattern PX2.

Referring to FIG. 32, reference numeral 84 denotes a light-transmitting glass substrate such as a quartz substrate, and reference numeral 85 denotes a light-shielding member consisting of chromium, for example. In this case, the openings 82a, 82b, and 82c are formed in the light-shielding member 85 to form a pattern.

Referring to FIG. 33, reference numeral 84 denotes a light-transmitting glass substrate such as a quartz substrate, and reference numeral 85 denotes a light-shielding member consisting of chromium, for example. The openings 83a, 83b, and 83c are formed in the light-shielding member 85 as in the embodiment of FIG. 32. However, FIG. 33 is different from FIG. 32 in that phase-shift films (layers) 83a1, 83a2, 83b1, 83b2, 83c1, and 83c2 are formed at positions slightly spaced apart from each of the openings 83a, 83b, and 83c.

In this case, the phase-shift films 83a1, 83a2, 83b1, 83b2, 83c1, and 83c2 invert the phases of light fluxes which pass through the phase-shift films, and operate to improve the resolutions of the pattern constituted by the openings 83a, 83b, and 83c. The resolution improvement technique with the above arrangement is popularly known as "an edge enhancing type phase-shift method". More specifically, when the reticle according to this embodiment is used, the resolution of the second cycle pattern PX2 can be relatively improved with respect to the resolution of the first cycle pattern PX1.

Figure 34:
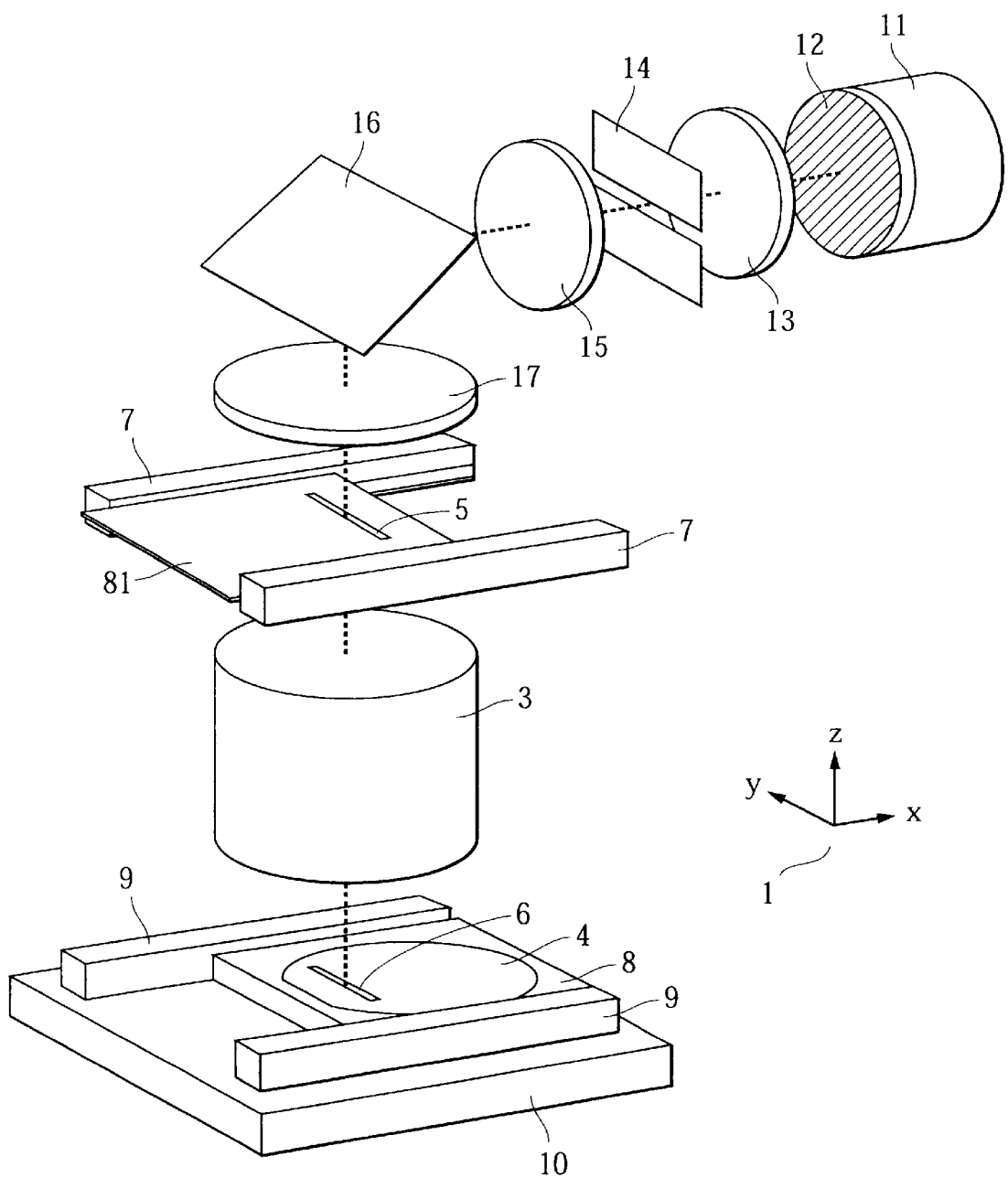
FIG. 34 is a schematic view showing a main portion of a projection exposure apparatus according to the fourth embodiment of the present invention.

FIG. 34 is a schematic view showing a main portion of a step and scan projection exposure apparatus to which the reticle according to the fourth embodiment is applied. Referring to FIG. 34, reference numeral 81 denotes a reticle on which a circuit pattern, serving as a first object, is drawn; 3, a projection lens (projection optical system mirror (or a combination of a lens and a mirror)); and 4, a semiconductor wafer (e.g., a silicon wafer) serving as a second object.

In this embodiment, the circuit pattern on the reticle 81 is projected and exposed onto the wafer 4, which is coated with a photosensitive material such as a resist, at a magnification of 1/N times (N>1) by a step and scan scheme through the projection lens 3. In the exposure apparatus using the step and scan scheme, the pattern on the reticle 81 is not illuminated all at once, but an illumination area 5 having a slit-like shape is formed. The pattern on the reticle 81 located in the illumination area 5 is transferred onto an exposure area 6 on the wafer 4 through the projection lens 3.

During exposure, the reticle 81 is scanned by relatively moving a reticle stage 7 in the x direction. The wafer 4 is placed on a movable stage 8, and, during exposure, the movable stage 8 is scanned along a guide portion 9 in the −x direction, opposing the x direction movement of the reticle 81. Reference numeral 10 denotes a stage on which the entire portions of the movable stage 8 and the guide portion 9 are placed. The stage 10, together with the movable stage 8 and the guide portion 9, constitute a wafer stage. The reticle 81 and the wafer 4 are synchronously scanned at a speed ratio corresponding to the projection magnification of the projection lens 3, in opposite directions. The scanning speed of the wafer 4 is obtained by multiplying the projection magnification of the projection lens 3 by the scanning speed of the reticle 81.

Reference numeral 11 denotes a light source unit including a light source such as an excimer laser or a high-pressure mercury lamp and a plurality of optical elements. Reference numeral 12 denotes a light-exit portion of a homogenizer (integrator) (not shown) such as a fly's eye array lens. In an actual apparatus, a secondary light source is formed at the position of the light-exit portion 12. The discussion below is made on an assumption that the light-exit portion 12 is considered to be a substantial light source. For this reason, for convenience, the light-exit portion 12 is called a "secondary light source".

The illumination light flux from the secondary light source 12 is guided to a reticle blind 14 through a lens 13. The reticle blind 14 has a slit-like opening extending in the y direction, as shown in FIG. 34, to provide the slit-like illumination area 5. The light flux from the slit-like opening of the reticle blind 14 illuminates the reticle 81 through a lens 15, a mirror 16, and a condenser lens 17.

In this case, the reticle blind 14 and the reticle 81 are arranged at optically conjugate positions, and the reticle blind 14 or the reticle 81 and the secondary light source 12 have an optical Fourier transform relationship.

In the step and scan projection exposure apparatus shown in FIG. 34, when a conventional reticle is used, as described above with respect to FIGS. 13(A) through 14(B-3), high-frequency asynchronous vibration is generated to extend the image in the scanning direction and to degrade the resolution. As a result, a resolution in the scanning direction is apparently more degraded than a resolution in the direction perpendicular to the scanning direction, and a pattern to be transferred onto a wafer cannot easily be controlled in size.

When the reticle according to the fourth embodiment shown in FIG. 31 is used, improvement of the resolution obtained by applying the edge enhancing type phase-shift method to the repetitive pattern in the scanning direction and degradation of the resolution caused by scanning cancel each other out. As a result, on the wafer, the resolution equal to that in a direction other than the scanning direction can be obtained in the scanning direction.

Figure 35A:
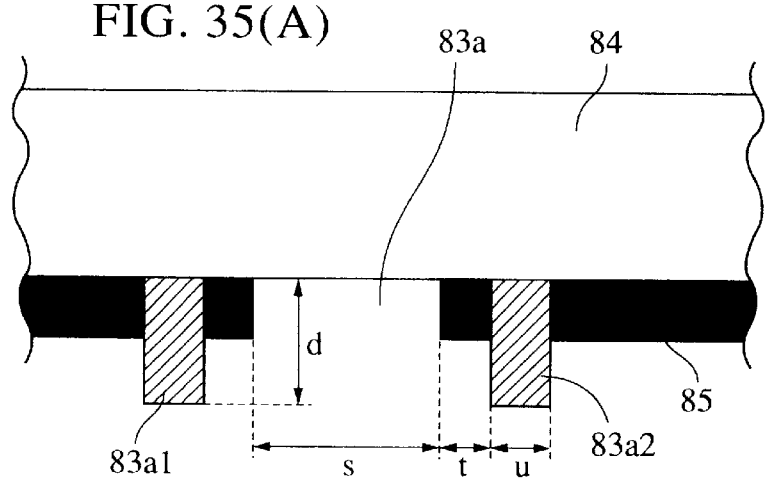
FIGS. 35(A) through 35(D) are views for explaining a reticle according to the fourth embodiment.
Figure 35B:
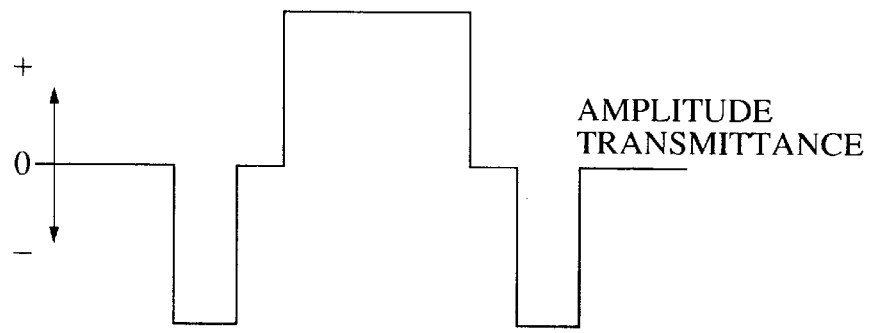
Figure 35C:
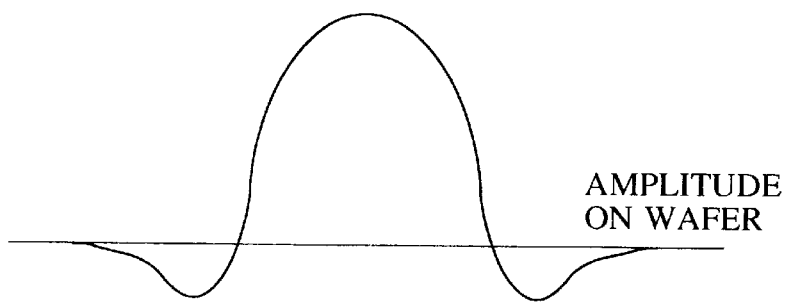

FIG. 35(A) is an enlarged view showing a portion near the opening 83a of the repetitive pattern (pattern shown in FIG. 33) in the scanning direction. Referring to FIG. 35(A), reference symbol d denotes the thickness of a phase-shifter portion (film); s, the extension of the opening; t an interval between the opening and the phase-shifter portion; and u, the width of the phase-shifter portion. FIG. 35(B) shows the amplitude transmittance of light obtained by the pattern in FIG. 35(A), and shows that amplitudes are negative at the phase-shift portions 83a1 and 83a2. FIG. 35(C) shows the amplitude of light formed on a wafer, and FIG. 35(D) shows a light intensity which is finally obtained.

Figure 35D:
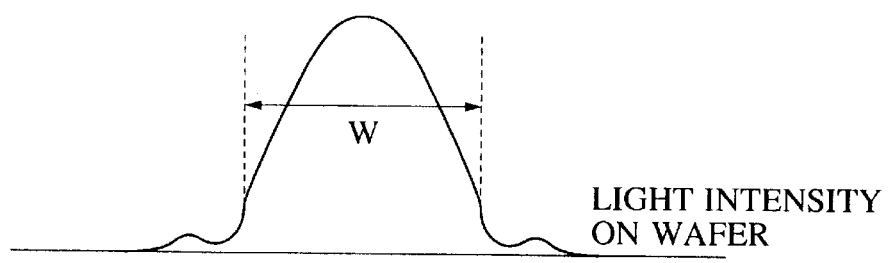

In FIG. 35(D), reference symbol W denotes an extension of a light intensity distribution. The size of extension W can be adjusted within a certain range by changing the values d, s, t, and u shown in FIG. 35(A). When the reticle according to the fourth embodiment is to be applied to an actual step and scan projection exposure apparatus, the values d, s, t, and u are adjusted in consideration of the magnitude of an asynchronous high-frequency vibration component in the scanning direction in the exposure apparatus. In this manner, the reticle is optimally used to correct the influence of the vibration.

A method of applying the fourth embodiment to a pattern having a repetitive cycle in a direction other than the scanning direction and the direction perpendicular to the scanning direction will be described below with reference to FIG. 36. Referring to FIG. 36, reference numeral 88 denotes a reticle; S, a scanning direction; and 90, a cycle pattern. An arrow a indicates a vector defined in the repetitive direction of the cycle pattern 90; $\beta$, the component of a in the scanning direction; and $\gamma$, the component of $\alpha$ in the direction perpendicular to the scanning direction.

Degradation of an image caused by vibration increases as the repetitive direction of a pattern is brought close to the direction parallel to the scanning direction. More specifically, the magnitude of the influence of vibration can be expressed using a value $\beta/\alpha$ as a parameter. For this reason, the method according to the fourth embodiment can be applied to the cycle pattern in an oblique direction like the pattern 90 by adjusting the correction amount according to the value $\beta/\alpha$. More specifically, the edge enhancing type phase-shift method is applied to the cycle pattern 90, and, at this time, the parameters described in FIG. 35(A) may be properly adjusted.

Figure 37:
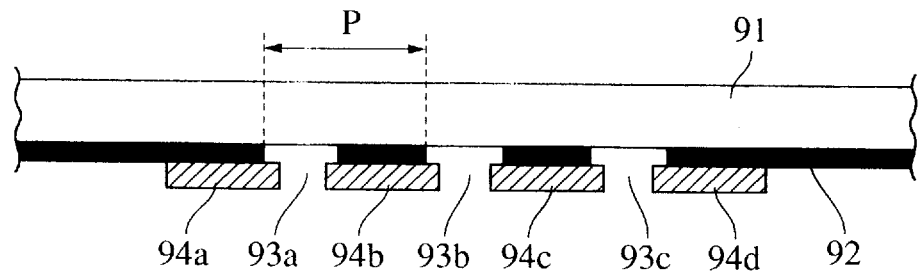
FIG. 37 is a view for explaining still another reticle according to the fourth embodiment.
Figure 38:
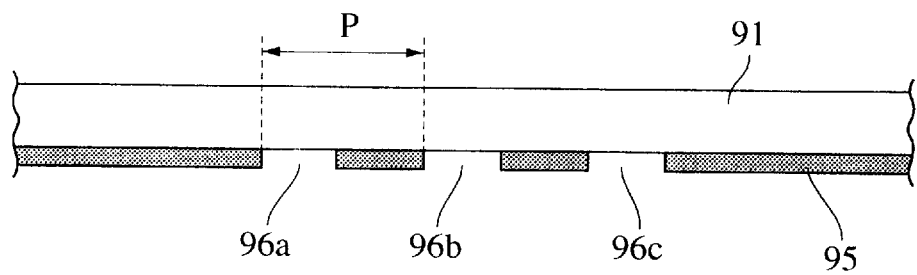
FIG. 38 is a view for explaining still another reticle according to the fourth embodiment.
Figure 39:
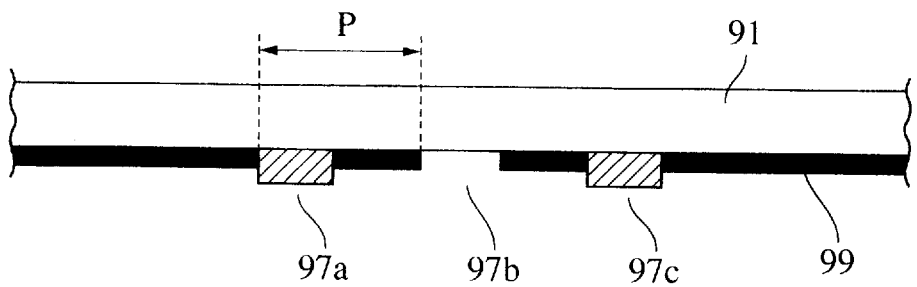
FIG. 39 is a view for explaining still another reticle according to the fourth embodiment.

Although the description up to this is made by using the edge enhancing type phase-shift method, other phase-shift methods can also be used. FIGS. 37, 38, and 39 show examples obtained by applying other phase-shift methods to a cycle pattern in which three openings are formed at a pitch P in the scanning direction as in FIG. 33.

A method popularly known as a "rim type phase-shift method" will be described first with reference to FIG. 37. Referring to FIG. 37, reference numeral 91 denotes a glass substrate consisting of quartz or the like; 92, a light-shielding member; and 93a, 93b, and 93c, openings through which light passes. Reference numerals 94a, 94b, 94c, and 94d denote phase-shift members which are arranged to partially overlap the peripheral portions of the openings, so that the same effect as that of the edge enhancing type phase-shift method can be obtained.

A method popularly known as a "halftone type phase-shift method" will be described below with reference to FIG. 38. Reference numeral 91 denotes a glass substrate consisting of quartz or the like; 95, a halftone phase-shifter portion; and 96a, 96b, and 96c, openings. The halftone phase-shifter portion 95 has transmittance with respect to exposure light to some extent, and operates to invert the phase of transmitted light. With this arrangement, the resolution of a pattern is improved.

A method popularly known as a "Levenson type phase-shift method" will be described below with reference to FIG. 39. Reference numeral 91 denotes a glass substrate consisting of quartz or the like; 99, a light-shielding portion; and 97a, 97b, and 97c, openings through which light passes. Phase shifters which have transmittance with respect to exposure light and indicated by hatched portions in FIG. 39 are arranged in such a manner that light passing through each of the openings 97a and 97c has a phase opposite to the phase of light passing through the opening 97b. With this arrangement, the resolution of a pattern is improved.

A method of applying the method according to the fourth embodiment to an isolated hole pattern will be described below with reference to FIG. 40. This embodiment solves a problem that an image extends in a scanning direction to distort the shape of the image as described above with respect to FIGS. 13(A) and 13(B) using a conventional reticle.

Figure 40:
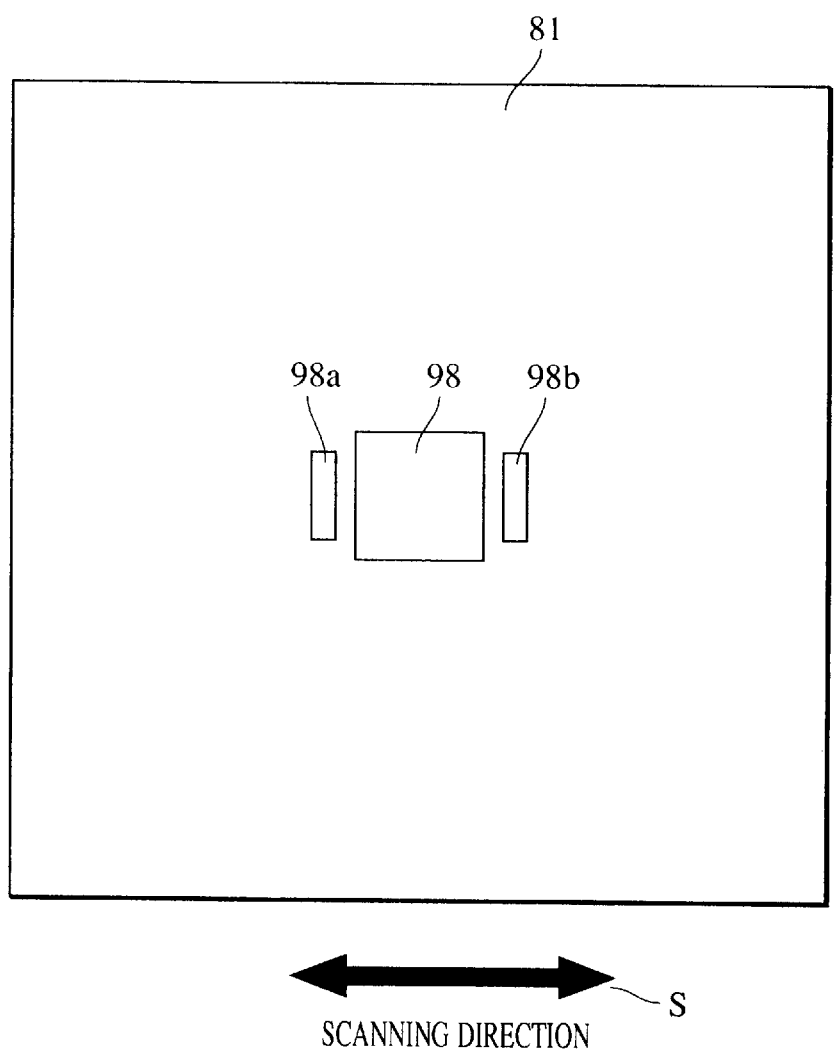
FIG. 40 is a view for explaining still another reticle according to the fourth embodiment.

Referring to FIG. 40, reference numeral 81 denotes an entire reticle; 98, a pattern opening; and 98a and 98b, phase-shifter portions. A technique in which an edge enhancing type phase-shift method is applied to an isolated hole pattern to improve a resolution is popularly known. In the fourth embodiment, the phase-shifter portions 98a and 98b are arranged on only the sides of the pattern opening 98 in scanning directions S such that the resolution is improved in only the scanning directions S. For this reason, in the scanning directions S, improvement of the resolution obtained by applying the edge enhancing type phase-shift method and degradation of the resolution caused by scanning cancel each other out. As a result, on the wafer, a light intensity distribution whose distortion is corrected can be obtained.

Finally, the description of the fourth embodiment has been made on the assumption that the degradation of the image in the scanning direction is greater than that in the direction perpendicular to the scanning direction due to the influence of vibration generated by scanning. In fact, in a typical exposure apparatus, the influence of degradation of an image in the scanning direction conspicuously appears. However, when the influence of vibration in the direction perpendicular to the scanning direction is relatively large under some special conditions, the direction in which the resolution is improved by a phase shift method may be determined to be the direction perpendicular to the direction described in this embodiment.

Figure 41:
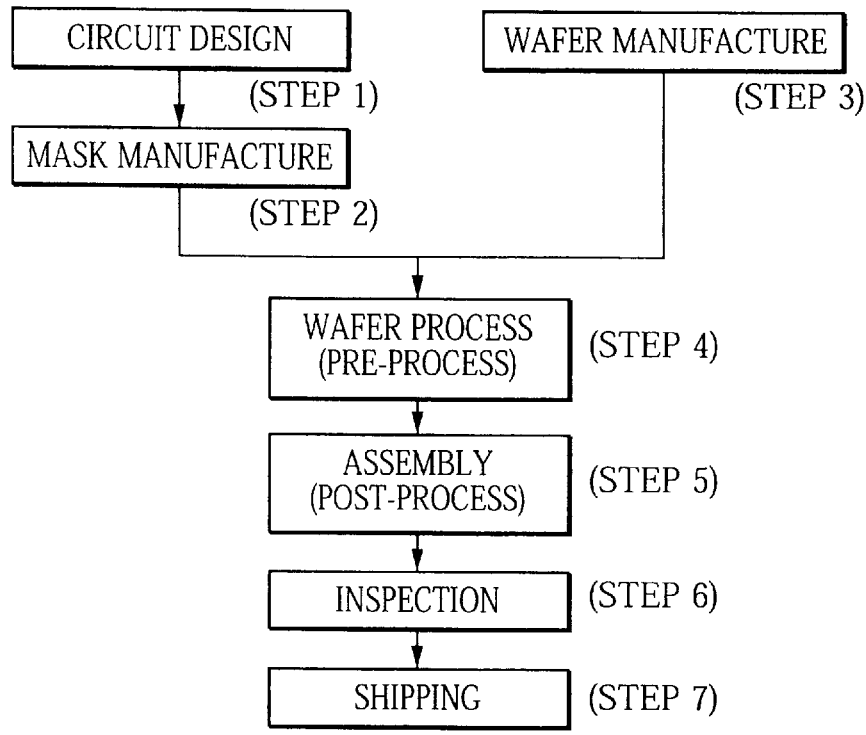
FIG. 41 is a flow chart of a method of manufacturing a device according to the present invention.

An embodiment of a method of manufacturing a device using the above-mentioned scanning type exposure apparatus and a photomask will be described below. FIG. 41 is a flow chart of a method of manufacturing a semiconductor device (e.g., a semiconductor chip such as an IC or LSI, or a liquid crystal panel or a CCD).

In this embodiment, in step 1 (circuit design), the circuit of a semiconductor device is designed. In step 2 (mask manufacture), a mask on which the designed circuit pattern is formed is manufactured. In step 3 (wafer manufacture), a wafer is manufactured using a material such as silicon. In step 4 (wafer process), called a pre-process, an actual circuit is formed on the wafer by a lithography technique using the prepared mask and wafer.

Next, step 5 (assembly) is called a post-process, and is the step of forming a semiconductor chip by using the wafer manufactured in step 4. Step 5 includes steps such as an assembly step (dicing and bonding) and a packaging step (chip sealing). In step 6 (inspection), inspections such as an operation check test and a durability test are performed for the semiconductor device manufactured in step 5. Semiconductor devices are completed through these steps, and they are shipped (step 7).

Figure 42:
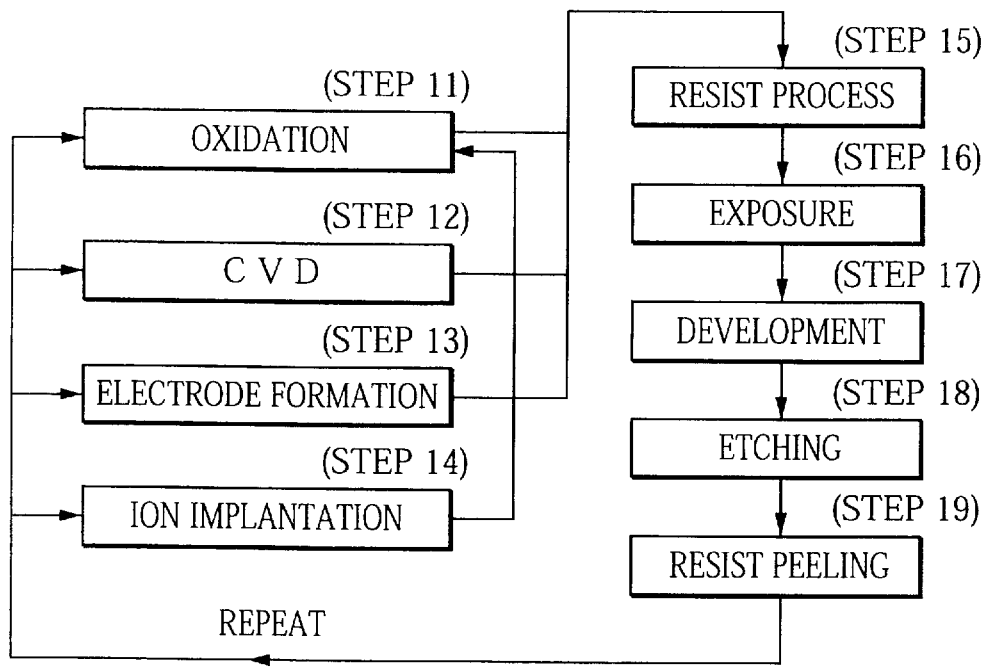
FIG. 42 is a flow chart of a wafer process used in the manufacturing method of FIG. 41.

FIG. 42 is a detailed flow chart of a wafer process (step 4 in FIG. 41). In step 11 (oxidation), the surface of a wafer is oxidized. In step 12 (CVD), an insulating film is formed on the wafer surface. In step 13 (electrode formation), electrodes are formed on the wafer by deposition. In step 14 (ion implantation), ions are implanted in the wafer. In step 15 (resist process), a photosensitive agent is coated on the wafer.

In step 16 (exposure), the circuit pattern of the mask is printed and exposed on the wafer by the exposure apparatus described above. In step 17 (development), the exposed wafer is developed. In step 18 (etching), a portion other than the portion on which the developed resist is formed is etched. In step 19 (resist peeling), the unnecessary resist after etching is removed. When these steps are repeated, circuit patterns which form a multilayered structure are formed on the wafer.

A device having a high integration density can be easily manufactured by using the manufacturing method of this embodiment.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A scanning type exposure apparatus comprising:

illumination means for illuminating a mask;

projection means for projecting a pattern of the mask onto a substrate; and scanning means for scanning, in a scanning direction, the mask and the substrate relative to said illumination means and said projection means, wherein said projection means comprises means for setting an effective numerical aperture in the scanning direction to be larger than an effective numerical aperture in a direction perpendicular to the scanning direction.

2. An apparatus according to claim 1, wherein said setting means sets the effective numerical aperture in the scanning direction and the effective numerical aperture in the perpendicular direction such that resolutions of said apparatus in the scanning direction and in the perpendicular direction are equal to each other.

3. An apparatus according to claim 2, wherein said setting means comprises a stop having an opening whose diameter in the scanning direction is larger than the diameter in the perpendicular direction.

4. An apparatus according to claim 2, wherein said setting means comprises a stop having an opening that provides a predetermined transmittance distribution in which a change in transmittance in the perpendicular direction is different from a change in transmittance in the scanning direction.

5. An apparatus according to claim 1, wherein said setting means comprises a stop having an opening whose diameter in the scanning direction is larger than the diameter in the perpendicular direction.

6. An apparatus according to claim 1, wherein said setting means comprises a stop having an opening that provides a predetermined transmittance distribution in which a change in transmittance in the perpendicular direction is different from a change in transmittance in the scanning direction.

7. An apparatus according to claim 1, wherein said scanning means comprises a mask stage which moves while holding the mask, and a substrate stage which moves while holding the substrate, independently of said mask stage, and said scanning means synchronously moves said mask stage and said substrate stage at a rate corresponding to a projection magnification of said projection means in the scanning direction.

8. An apparatus according to claim 7, wherein the projection magnification of said projection means is 1/N, where N>1.

9. A device manufacturing method comprising the step of transferring a device pattern onto a substrate by using an apparatus according to any one of claims 1–8.

10. A scanning type exposure apparatus comprising:
illumination means for illuminating a mask;
projection means for projecting a pattern of the mask onto a substrate; and
scanning means for scanning, in a scanning direction, the mask and the substrate relative to said illumination means and said projection means,
wherein said illumination means comprises means for setting an effective numerical aperture in the scanning direction to be larger than an effective numerical aperture in a direction perpendicular to the scanning direction.

11. An apparatus according to claim 10, wherein said setting means sets the effective numerical aperture in the scanning direction and the effective numerical aperture in the perpendicular direction such that resolutions of said apparatus in the scanning direction and in the perpendicular direction are equal to each other.

12. An apparatus according to claim 10, wherein said setting means comprises a stop having only two openings arranged in the scanning direction each of whose diameter in the scanning direction is larger than the respective diameter in the perpendicular direction.

13. An apparatus according to claim 10, wherein said scanning means comprises a mask stage which moves while holding the mask, and a substrate stage which moves while holding the substrate, independently of said mask stage, and said scanning means synchronously moves said mask stage and said substrate stage at a rate corresponding to a projection magnification of said projection means in the scanning direction.

14. An apparatus according to claim 13, wherein the projection magnification of said projection means is 1/N, where N>1.

15. A scanning type exposure apparatus comprising:
illumination means for illuminating a mask;
projection means for projecting a pattern of the mask onto a substrate; and
scanning means for scanning, in a scanning direction, the mask and the substrate relative to said illumination means and said projection means, respectively,
wherein an effective numerical aperture of said illumination means in the scanning direction is larger than an effective numerical aperture of said illumination means in a direction perpendicular to the scanning direction.

16. An apparatus according to claim 15, further comprising means for setting the effective numerical aperture in the scanning direction and the effective numerical aperture in the perpendicular direction such that resolutions of said apparatus in the scanning direction and in the perpendicular direction are almost equal to each other.

17. A scanning type exposure apparatus comprising:
illumination means for illuminating a mask;
projection means for projecting a pattern of the mask onto a substrate; and
scanning means for scanning, in a scanning direction, the mask and the substrate relative to said illumination means and said projection means,
wherein said illumination means comprises means for setting a numerical aperture in the scanning direction to be larger than a numerical aperture in a direction perpendicular to the scanning direction.

18. An apparatus according to claim 17, wherein said setting means sets the numerical aperture in the scanning direction and the numerical aperture in the perpendicular direction such that resolutions of said apparatus in the scanning direction and in the perpendicular direction are equal to each other.

19. An apparatus according to claim 17, wherein said setting means comprises a stop having only two openings arranged in the scanning direction each of whose diameter in the scanning direction is larger than the respective diameter in the perpendicular direction.

20. An apparatus according to claim 17, wherein said scanning means comprises a mask stage which moves while holding the mask, and a substrate stage which moves while holding the substrate, independently of said mask stage, and said scanning means synchronously moves said mask stage and said substrate stage at a rate corresponding to a projection magnification of said projection means in the scanning direction.

21. An apparatus according to claim 17, wherein the projection magnification of said projection means is 1/N, where N>1.

22. A scanning type exposure apparatus comprising:
illumination means for illuminating a mask;
projection means for projecting a pattern of the mask onto a substrate; and
scanning means for scanning, in a scanning direction, the mask and the substrate relative to said illumination means and said projection means,
wherein a numerical aperture of said illumination means in the scanning direction is larger than a numerical aperture of said illumination means in a direction perpendicular to the scanning direction.

23. An apparatus according to claim 22, further comprising means for setting the numerical aperture in the scanning direction and the numerical aperture in the perpendicular direction such that resolutions of said apparatus in the scanning direction and in the perpendicular direction are almost equal to each other.

24. A scanning type exposure apparatus comprising:
illumination means for illuminating a mask;
projection means for projecting a pattern of the mask onto a substrate; and
scanning means for scanning, in a scanning direction, the mask and the substrate relative to said illumination means and said projection means, wherein said projection means comprises means for setting a numerical aperture in the scanning direction to be larger than a numerical aperture in a direction perpendicular to the scanning direction.

25. An apparatus according to claim 24, wherein said setting means sets the numerical aperture in the scanning direction and the numerical aperture in the perpendicular direction such that resolutions of said apparatus in the scanning direction and in the perpendicular direction are equal to each other.

26. An apparatus according to claim 24, wherein said setting means comprises a stop having only two openings arranged in the scanning direction each of whose diameter in the scanning direction is larger than the respective diameter in the perpendicular direction.

27. An apparatus according to claim 24, wherein said scanning means comprises a mask stage which moves while holding the mask, and a substrate stage which moves while holding the substrate, independently of said mask stage, and said scanning means synchronously moves said mask stage and said substrate stage at a rate corresponding to a projection magnification of said projection means in the scanning direction.

28. An apparatus according to claim 27, wherein the projection magnification of said projection means is 1/N, where N>1.

29. A scanning type exposure apparatus comprising:

illumination means for illuminating a mask;

projection means for projecting a pattern of the mask onto a substrate; and scanning means for scanning, in a scanning direction, the mask and the substrate relative to said illumination means and said projection means, respectively, wherein a numerical aperture of said projection means in the scanning direction is larger than a numerical aperture of said projection means in a direction perpendicular to the scanning direction.

30. An apparatus according to claim 29, further comprising means for setting the numerical aperture in the scanning direction and the numerical aperture in the perpendicular direction such that resolutions of said apparatus in the scanning direction and in the perpendicular direction are almost equal to each other.

31. A device manufacturing method comprising the step of transferring a device pattern onto a substrate by using an apparatus according to any one of claims 10 through 30.

32. A scanning type exposure apparatus comprising:

illumination means for illuminating a mask;

projection means for projecting a pattern of the mask onto a substrate; and scanning means for scanning, in a scanning direction, the mask and the substrate relative to said illumination means and said projection means, wherein an effective numerical aperture of said projection means in the scanning direction is larger than an effective numerical aperture of said projection means in a direction perpendicular to the scanning direction.

33. An apparatus according to claim 32, further comprising means for setting the effective numerical aperture in the scanning direction and the effective numerical aperture in the perpendicular direction such that resolutions of said apparatus in the scanning direction and in the perpendicular direction are almost equal to each other.

* * * * *

UNITED STATES PATENT AND TRADEMARK OFFICE
CERTIFICATE OF CORRECTION

PATENT NO. : 5,872,617

DATED : February 16, 1999

INVENTOR : YASUYUKI UNNO

It is certified that error appears in the above-identified patent and that said Letters Patent is hereby corrected as shown below:

COLUMN 3:

line 40, "is" should be deleted; and
    line 62, "σis" should read --σ is--.

COLUMN 16:

line 67, "ad" should read --$\sigma_d$--.

COLUMN 22:

line 33, "arrow a" should read --arrow α--; and
    line 34, "of a" should read --of α--.

COLUMN 28:

line 21, "wherein" should read --¶ wherein--.

Signed and Sealed this

Twenty-first Day of September, 1999

Attest:

Q. TODD DICKINSON

*Attesting Officer*     *Acting Commissioner of Patents and Trademarks*